US011973044B2

(12) United States Patent
Shao et al.

(10) Patent No.: US 11,973,044 B2
(45) Date of Patent: Apr. 30, 2024

(54) NON-VOLATILE MEMORY WITH EFFICIENT SIGNAL ROUTING

(71) Applicant: SANDISK TECHNOLOGIES LLC, Addison, TX (US)

(72) Inventors: Shiqian Shao, Fremont, CA (US); Fumiaki Toyama, Cupertino, CA (US); Tuan Pham, San Jose, CA (US)

(73) Assignee: SanDisk Technologies LLC, Austin, TX (US)

( * ) Notice: Subject to any disclaimer, the term of this patent is extended or adjusted under 35 U.S.C. 154(b) by 203 days.

(21) Appl. No.: 17/560,610

(22) Filed: Dec. 23, 2021

(65) Prior Publication Data

US 2023/0207504 A1 Jun. 29, 2023

(51) Int. Cl.
*H01L 25/065* (2023.01)
*H01L 23/00* (2006.01)
*H01L 25/00* (2006.01)
*H01L 25/18* (2023.01)

(52) U.S. Cl.
CPC ............ *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ..... H01L 24/08; H01L 24/80; H01L 25/0657; H01L 2224/08145; H01L 25/18; H01L 25/50; H01L 2224/80895; H01L 2224/80896; H01L 2924/1431; H01L 2924/14511
See application file for complete search history.

(56) References Cited

U.S. PATENT DOCUMENTS

| 10,115,681 | B1 | 10/2018 | Ariyoshi |
| 10,727,246 | B2 | 7/2020 | Park |
| 2017/0179026 | A1 | 6/2017 | Toyama et al. |
| 2017/0243650 | A1 | 8/2017 | Ogawa et al. |
| 2020/0027509 | A1 | 1/2020 | Chen et al. |
| 2020/0251483 | A1 | 8/2020 | Utsumi |
| 2020/0357813 | A1 | 11/2020 | Tanzawa |

(Continued)

OTHER PUBLICATIONS

PCT International Search Report and Written Opinion dated Oct. 26, 2022, PCT Patent Application No. PCT/US2022/029510.

*Primary Examiner* — Thanh Y. Tran
(74) *Attorney, Agent, or Firm* — Vierra Magen Marcus LLP

(57) ABSTRACT

An integrated memory assembly comprises a control die bonded to a memory die. The memory die includes multiple non-volatile memory structures (e.g., planes, arrays, groups of blocks, etc.), each comprising a stack of alternating conductive and dielectric layers forming staircases at one or more edges of the non-volatile memory structures. The non-volatile memory structures are positioned with gaps between the non-volatile memory structures such that the gaps separate the staircases of adjacent non-volatile memory structures. Metal interlayer segments positioned in the gaps are connected to a top metal layer positioned above non-volatile memory structures and to one or more electrical circuits on the control die via zero, one or more other metal layers/segments.

19 Claims, 31 Drawing Sheets

(56) References Cited

U.S. PATENT DOCUMENTS

| | | |
|---|---|---|
| 2021/0118867 A1 | 4/2021 | Chen |
| 2021/0143169 A1 | 5/2021 | Lee |
| 2021/0349778 A1 | 11/2021 | Sharon |
| 2021/0375901 A1* | 12/2021 | Oh .......................... H10B 43/27 |

* cited by examiner

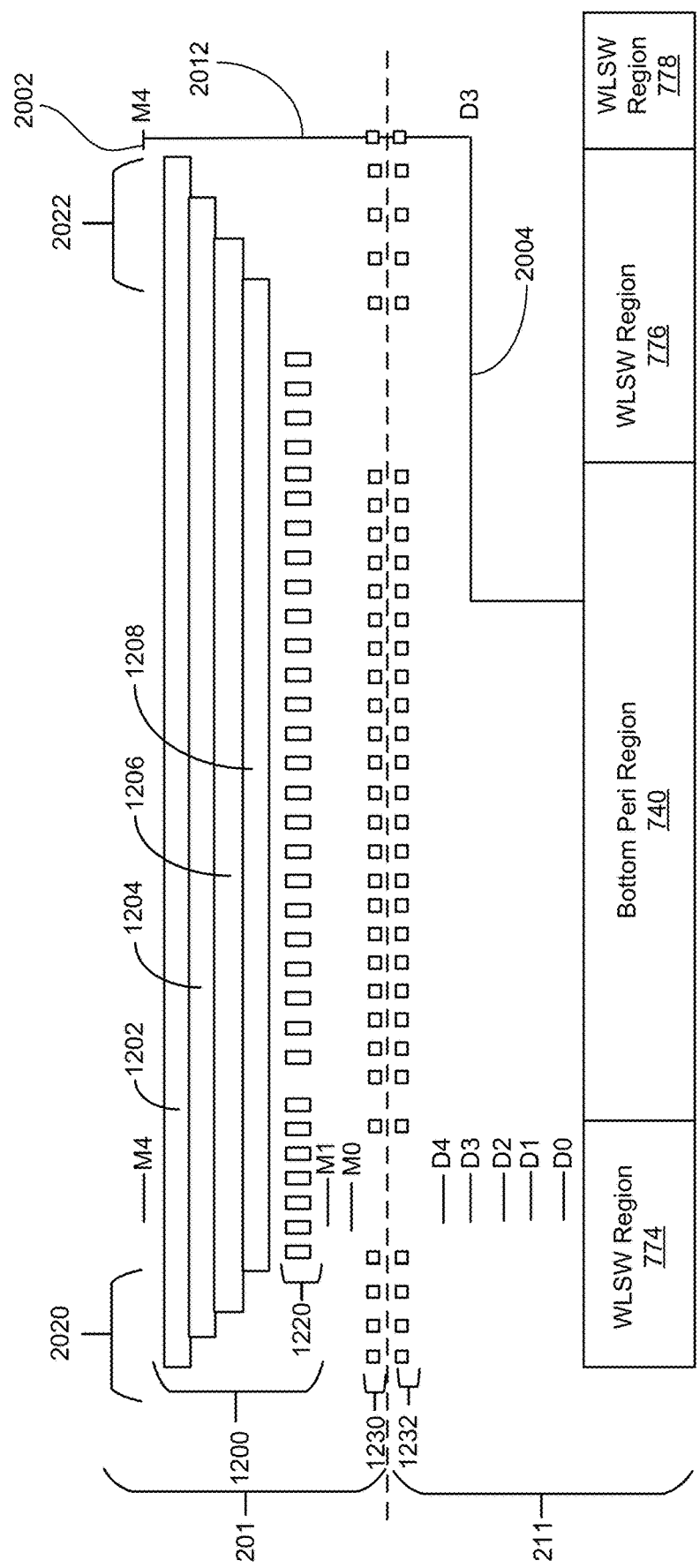

NON-VOLATILE MEMORY WITH EFFICIENT SIGNAL ROUTING

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

There is a trend to reduce the size of semiconductor die, as consumers want the size of electronics to be small. There is also a trend to increase the functionality of semiconductor die, as consumers want more features in their electronics. Adding more functionality typically results in the need for more signal lines (e.g., power, command and/or data) to be routed within the semiconductor die. As more signal lines are routed within a semiconductor die (e.g. semiconductor memory) and the semiconductor die is made smaller, congestion of the signal lines can occur such that it is not possible to include all of the signal limes needed to implement all of the desired functions.

BRIEF DESCRIPTION OF THE DRAWINGS

Like-numbered elements refer to common components in the different figures.

FIG. 21 is a cross section of an integrated memory assembly.

DETAILED DESCRIPTION

To resolve the congestion of the signal lines that can occur in semiconductor memory, it is proposed to include metal interlayer segments between memory structures of a semiconductor die, such that the metal interlayer segments communicate from above the memory structures to below the memory structures.

One embodiment of semiconductor memory includes an integrated memory assembly comprising a control die bonded to a memory die. The memory die includes multiple non-volatile memory structures (e.g., planes, arrays, groups of blocks, etc.), each comprising a stack of alternating conductive and dielectric layers forming staircases at one or more edges of the non-volatile memory structures. The non-volatile memory structures are positioned with gaps between the non-volatile memory structures such that the gaps separate the staircases of adjacent non-volatile memory structures. Metal interlayer segments positioned in the gaps are connected to a top metal layer positioned above non-volatile memory structures and to one or more electrical circuits on the control die via zero, one or more other metal layers/segments. More details are provided below.

Figure 1:
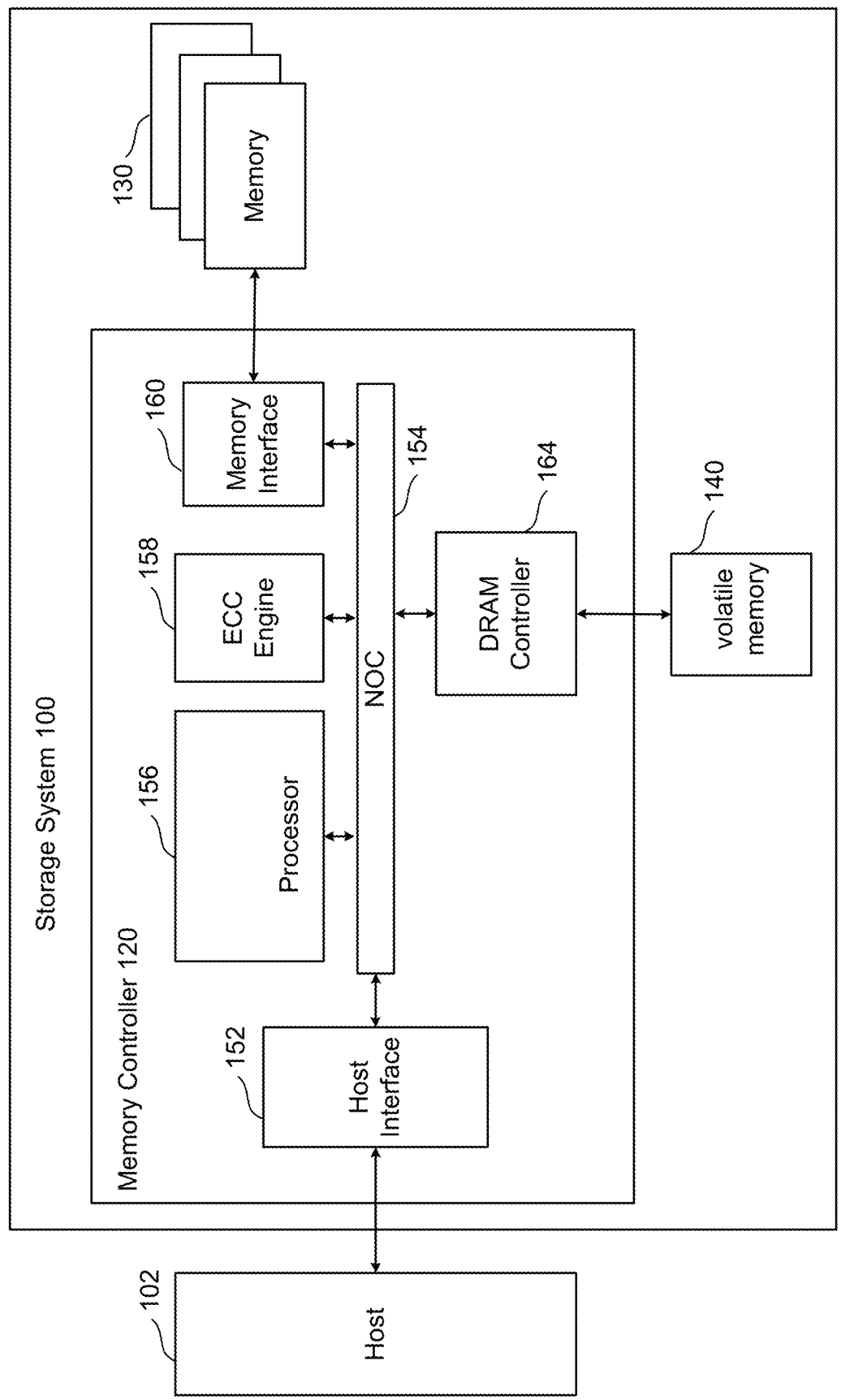
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
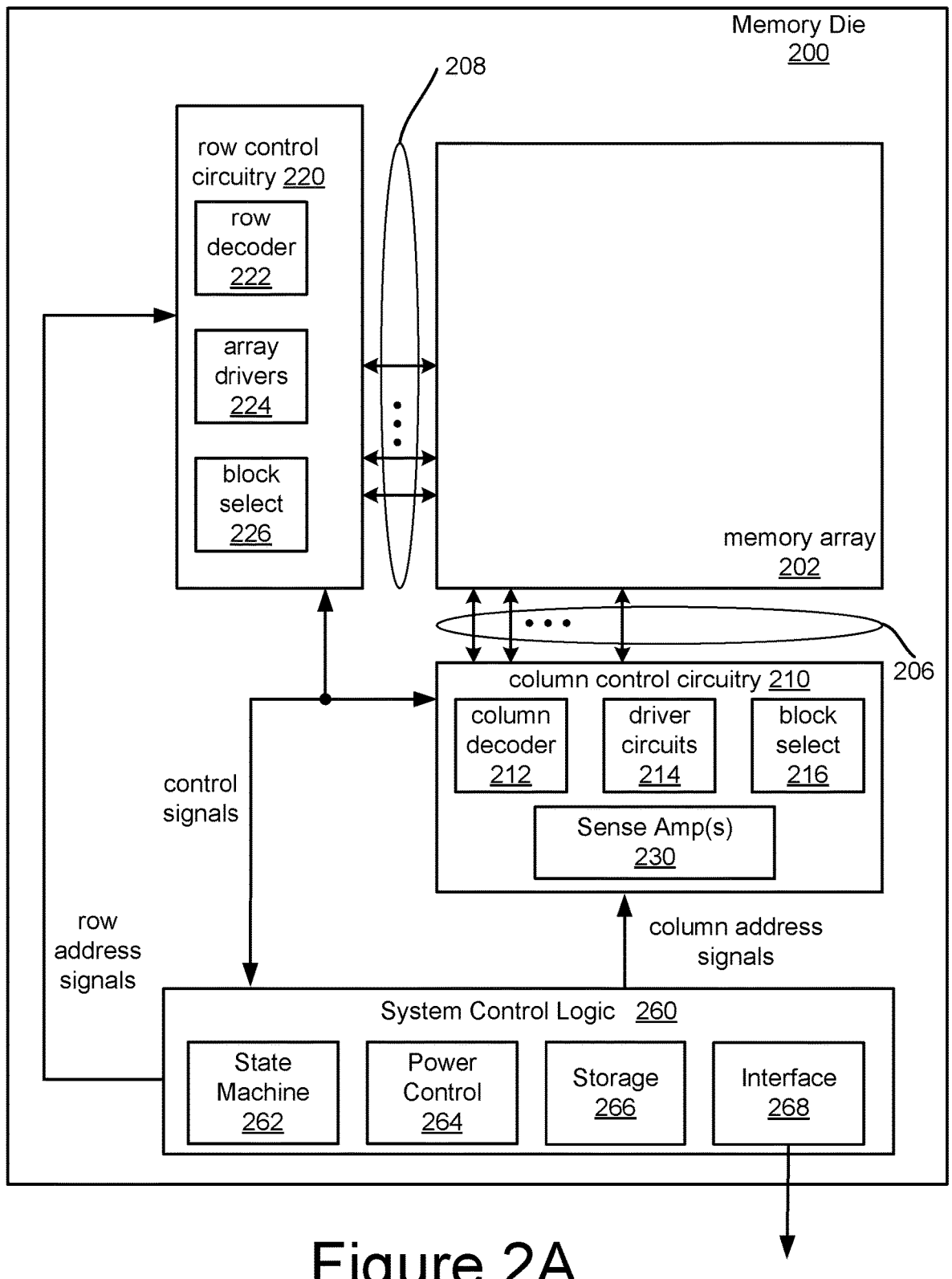
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
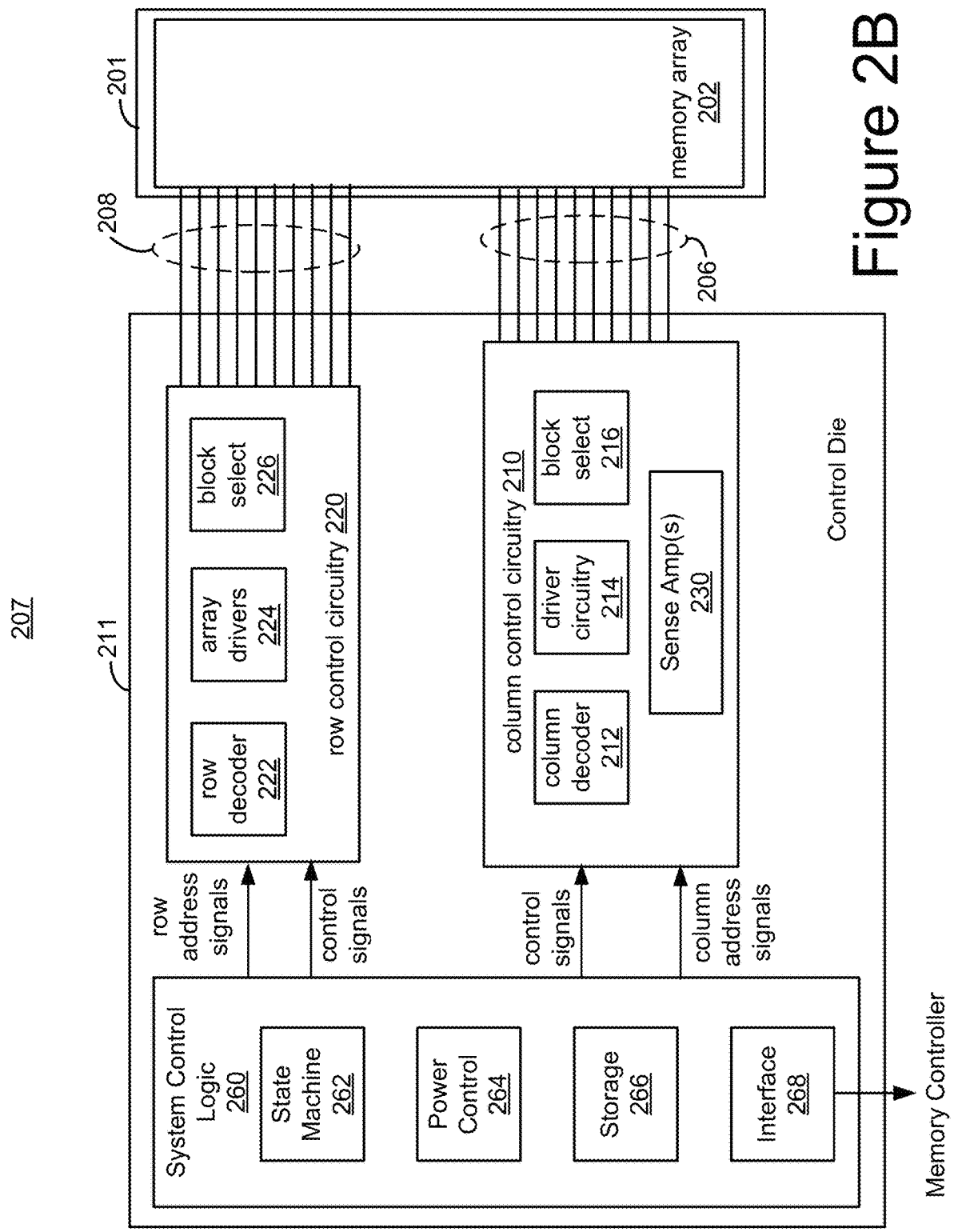
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
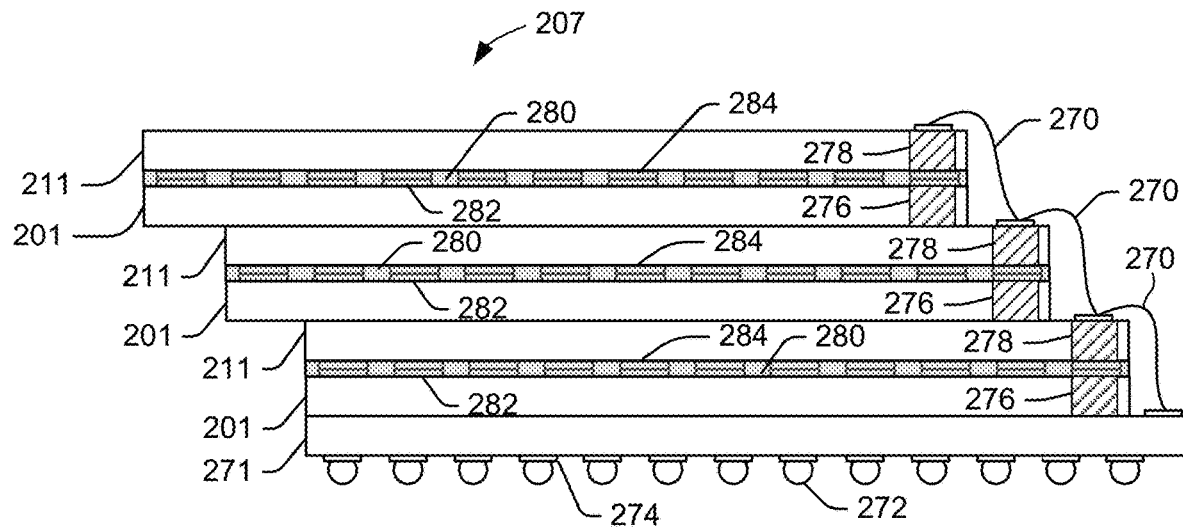
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211 via the bond pads, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
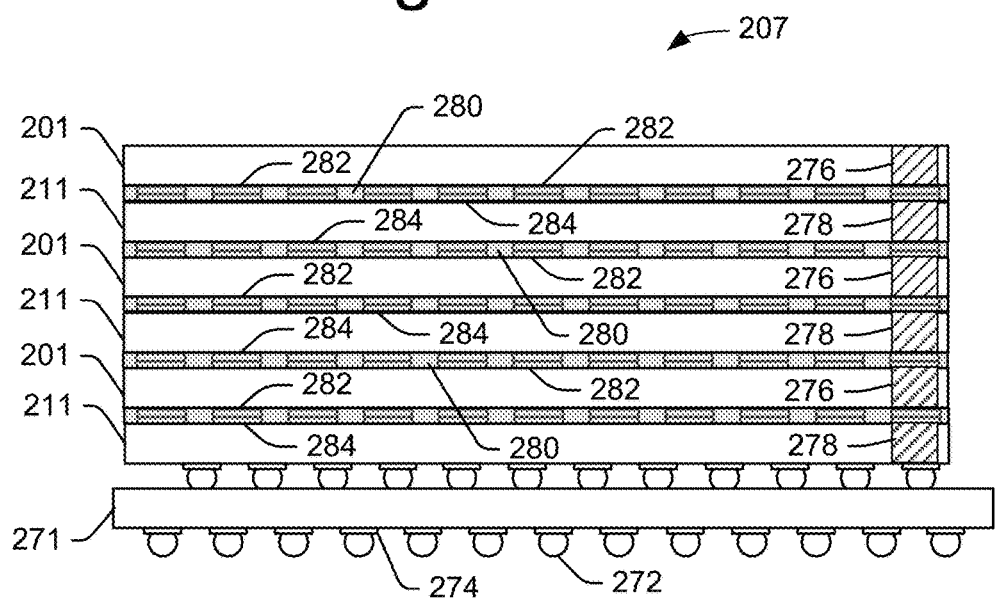

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
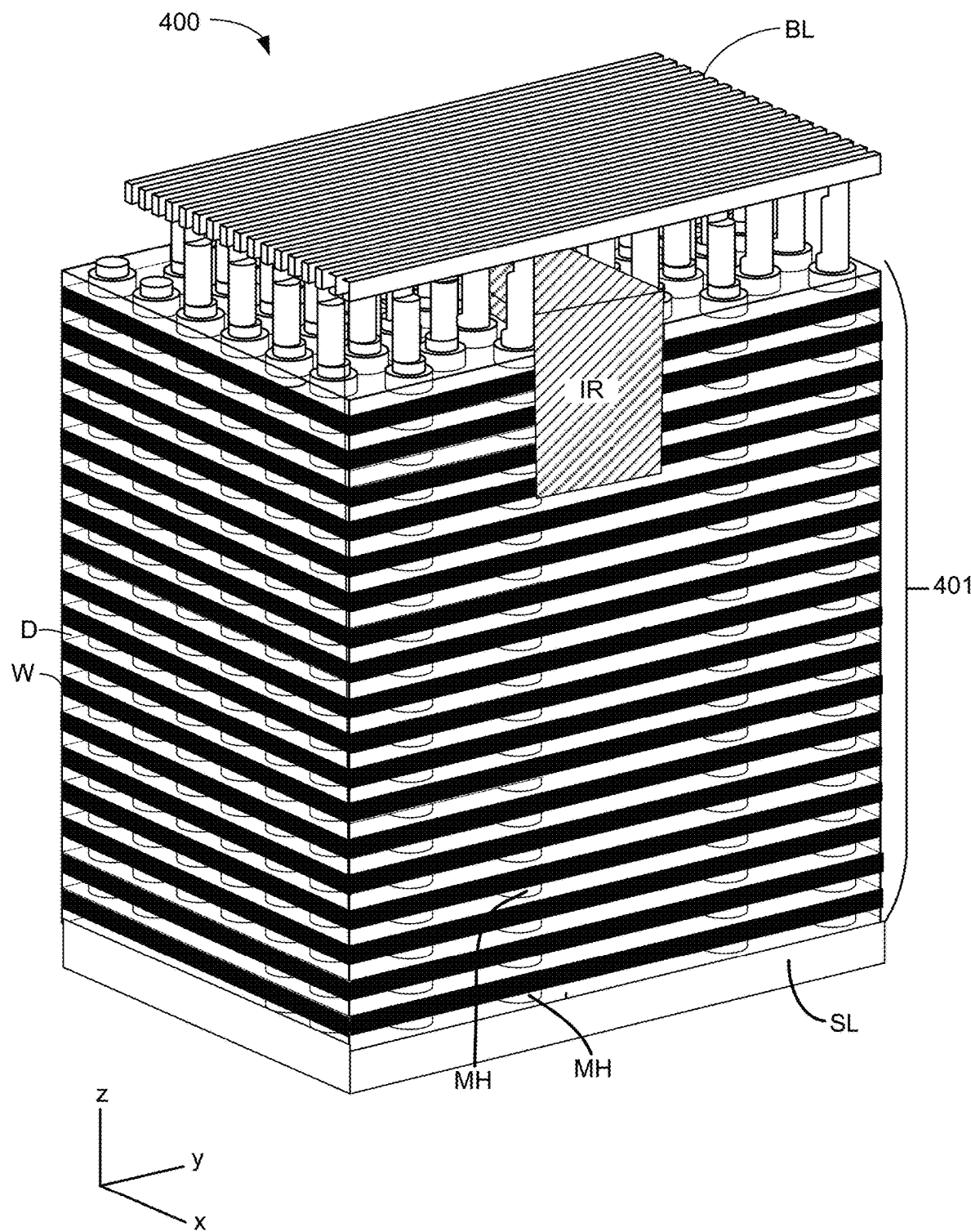
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
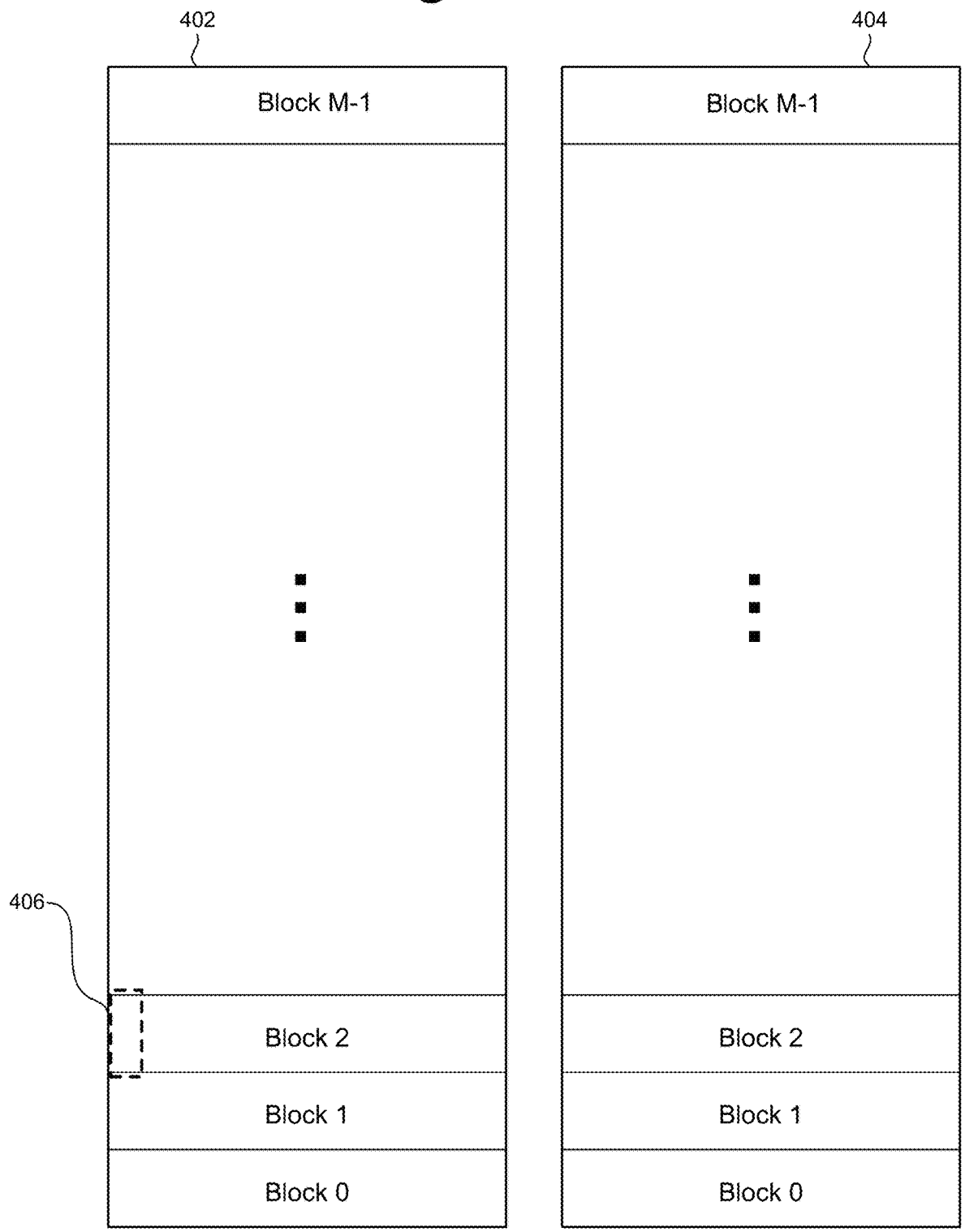
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all the vertical NAND strings for that block. Although FIG. 4A shows two planes 402/404, more or less than two planes can be implemented. In some embodiments, memory structure 202 includes eight planes.

Figure 4B:
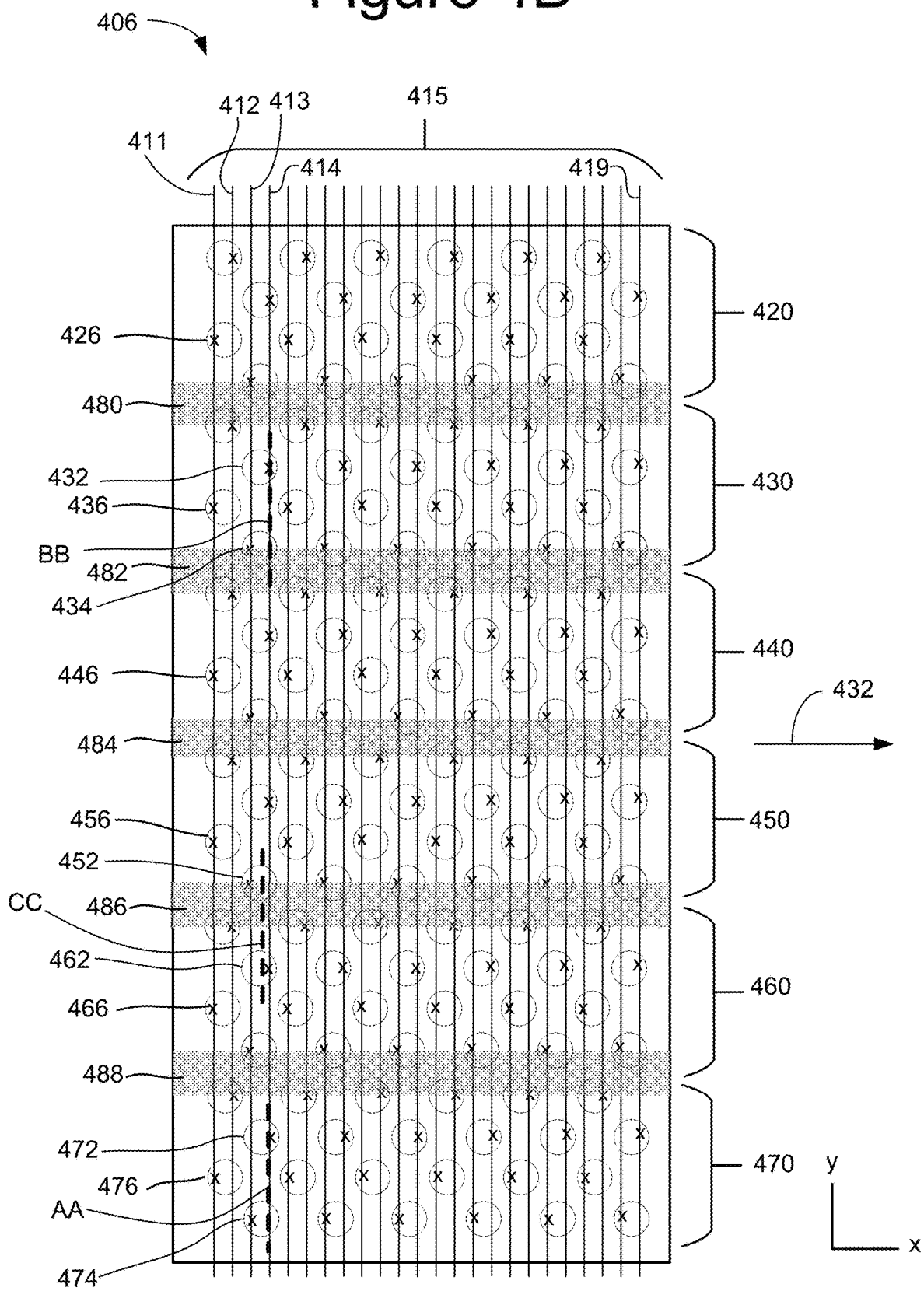
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of $SiO_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
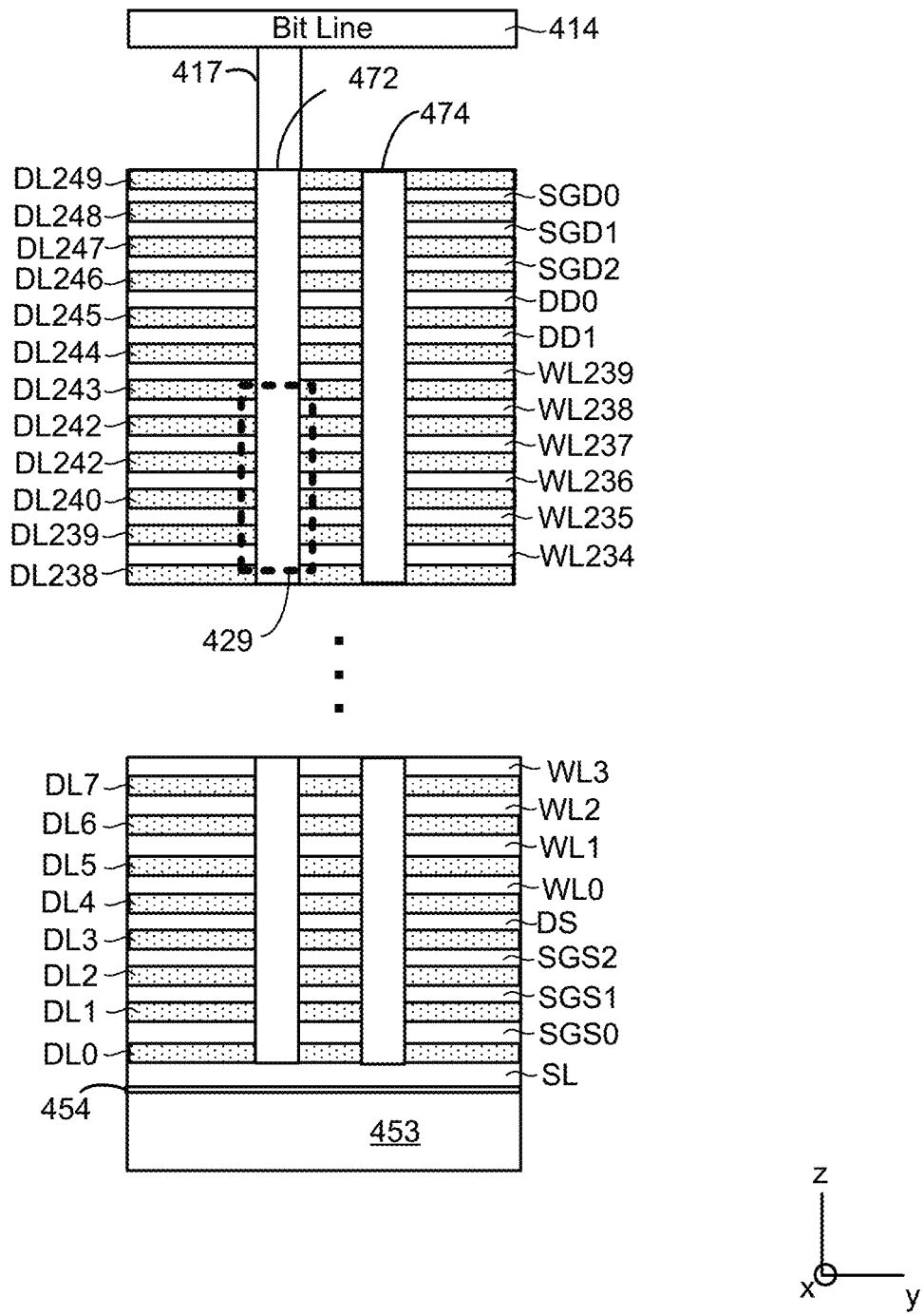
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; three dummy word line layers DD0, DD1, and DDS; two hundred and forty word line layers WL0-WL239 for connecting to data memory cells, and two hundred and fifty dielectric layers DL0-DL249. Other embodiments can implement more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host or entity outside of the storage system 100), such as data from a user of the host), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Note that the stack of word lines WL0-WL239 include two edge word lines at the edges of the stack, including top edge word line WL239 and bottom edge word line WL0. Word lines WL1-WL238 are non-edge word lines.

Figure 4D:
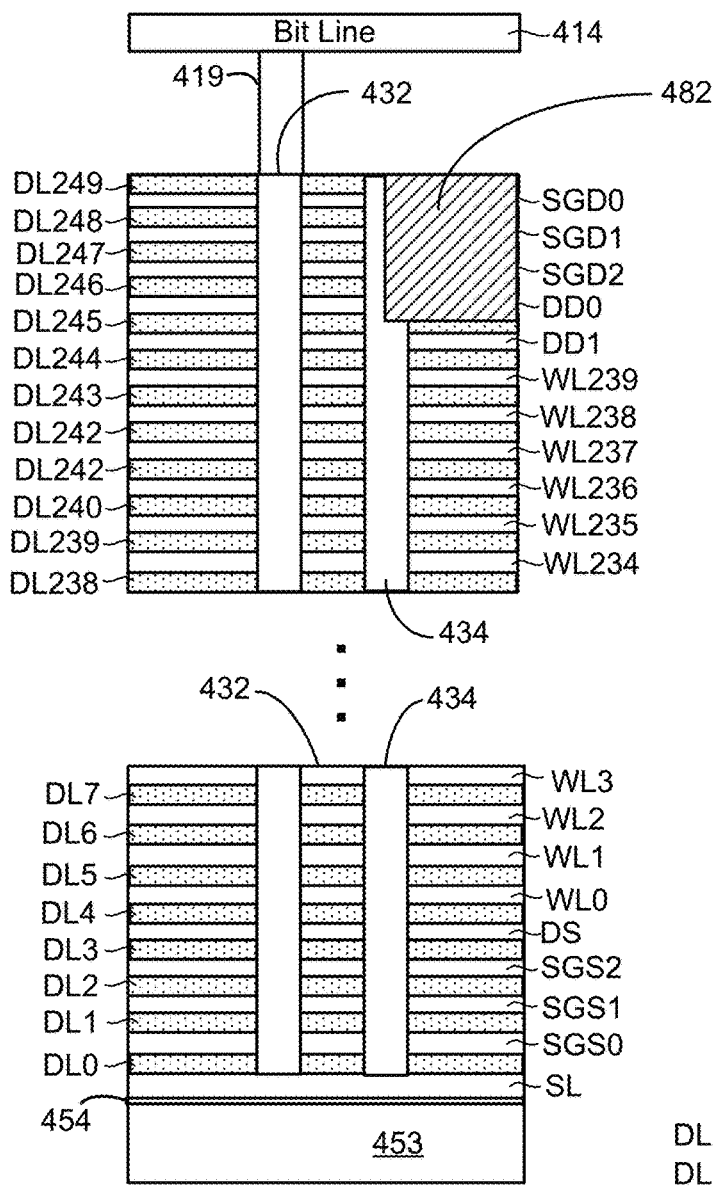
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 480, 482, 484, 486 and 488) occupy space that would have been used for a portion of the memory holes/vertical columns/NAND stings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with $SiO_2$.

Figure 4E:
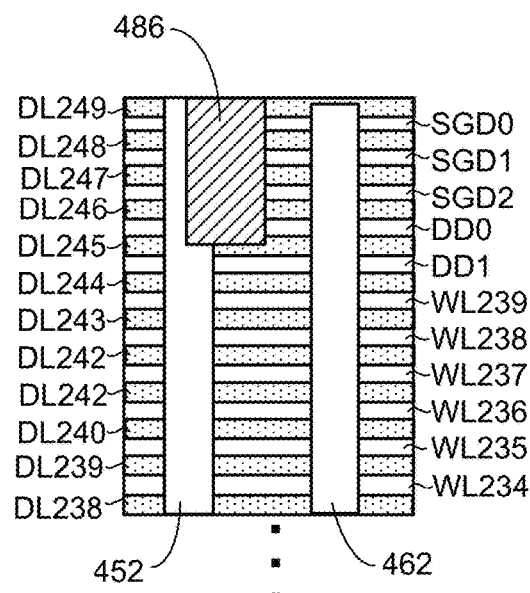
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 4624 (see FIG. 4B). FIG. 4E shows the same alternating conductive and dielectric layers as FIG. 4C. FIG. 4E also shows isolation region 486 cutting into vertical columns (NAND string) 452.

Figure 4F:
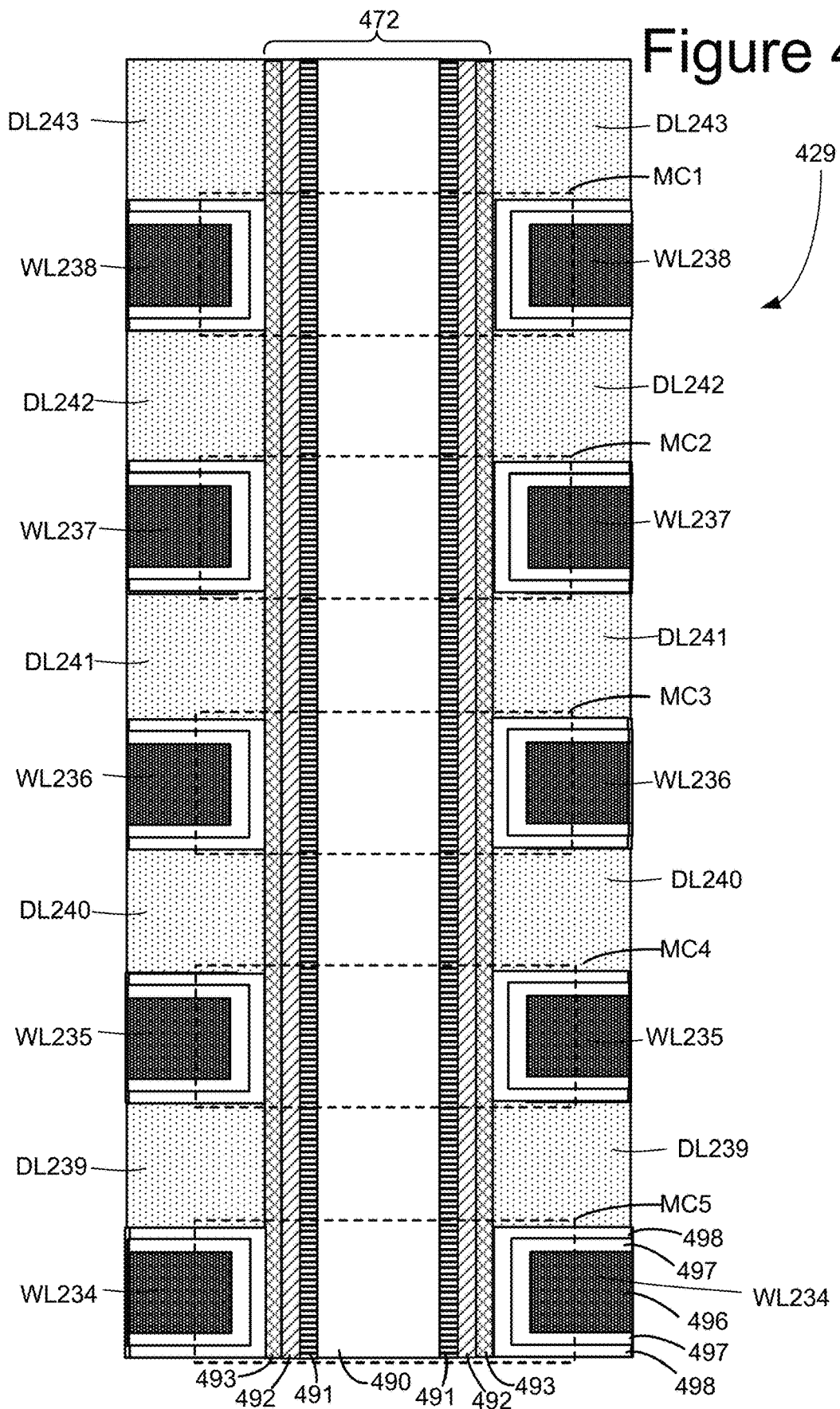
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DLL239, DLL240, DLL241, DLL242 and DLL243, as well as word line layers WLL234, WLL235, WLL236, WLL237, and WLL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WLL238 and a portion of vertical column 472 comprise a memory cell MC1. Word line layer WL237 and a portion of vertical column 472 comprise a memory cell MC2. Word line layer WLL236 and a portion of vertical column 472 comprise a memory cell MC3. Word line layer WLL235 and a portion of vertical column 472 comprise a memory cell MC4. Word line layer WLL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
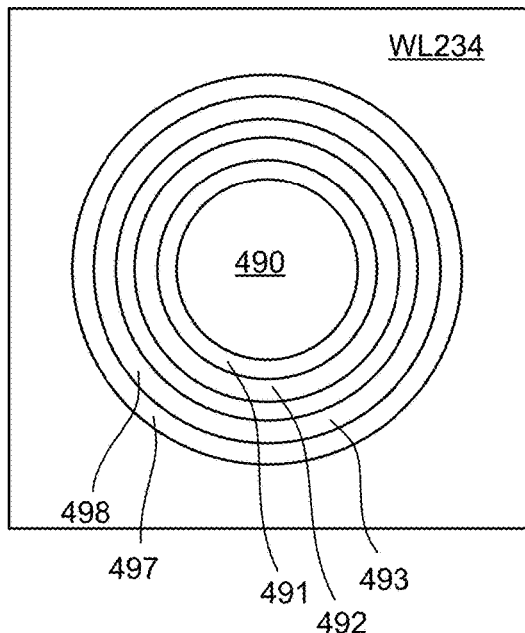
FIG. 4G depicts a cross section of a vertical column that implements a vertical NAND string.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498.

Figure 4H:
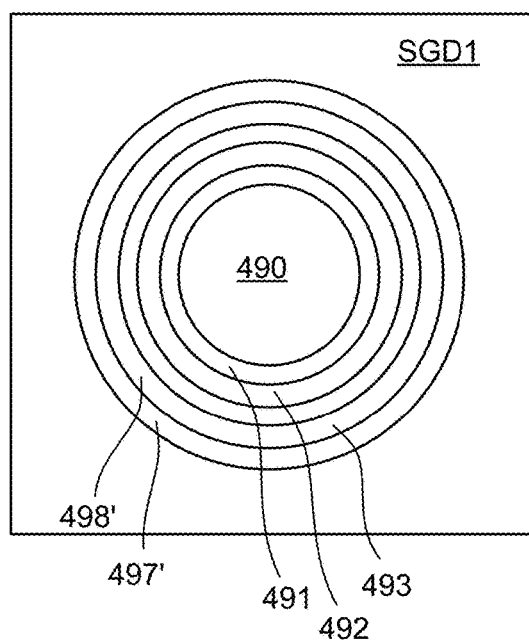
FIG. 4H depicts a cross section of a vertical column that implements a vertical NAND string.

FIG. 4H shows a cross section of vertical column 472 of FIG. 4F, cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
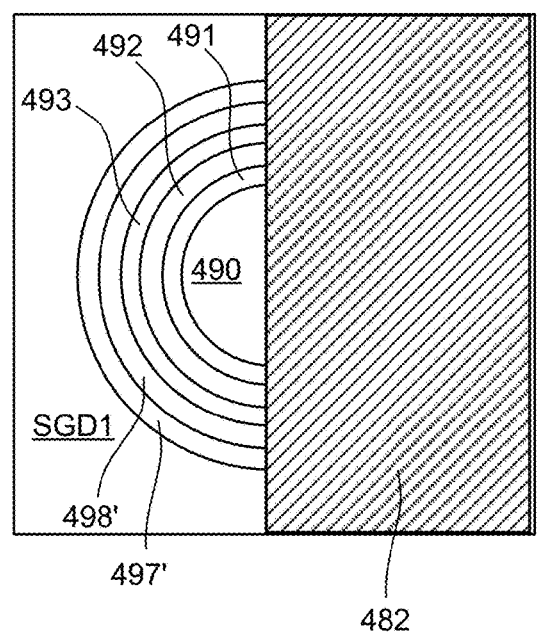
FIG. 4I depicts a cross section of a vertical column that implements a vertical NAND string.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer and select line layer) of vertical column 434 is semicircular in shape (or partially circular in shape) due to vertical column (NAND string) 434 intersecting isolation region 482.

Figure 4J:
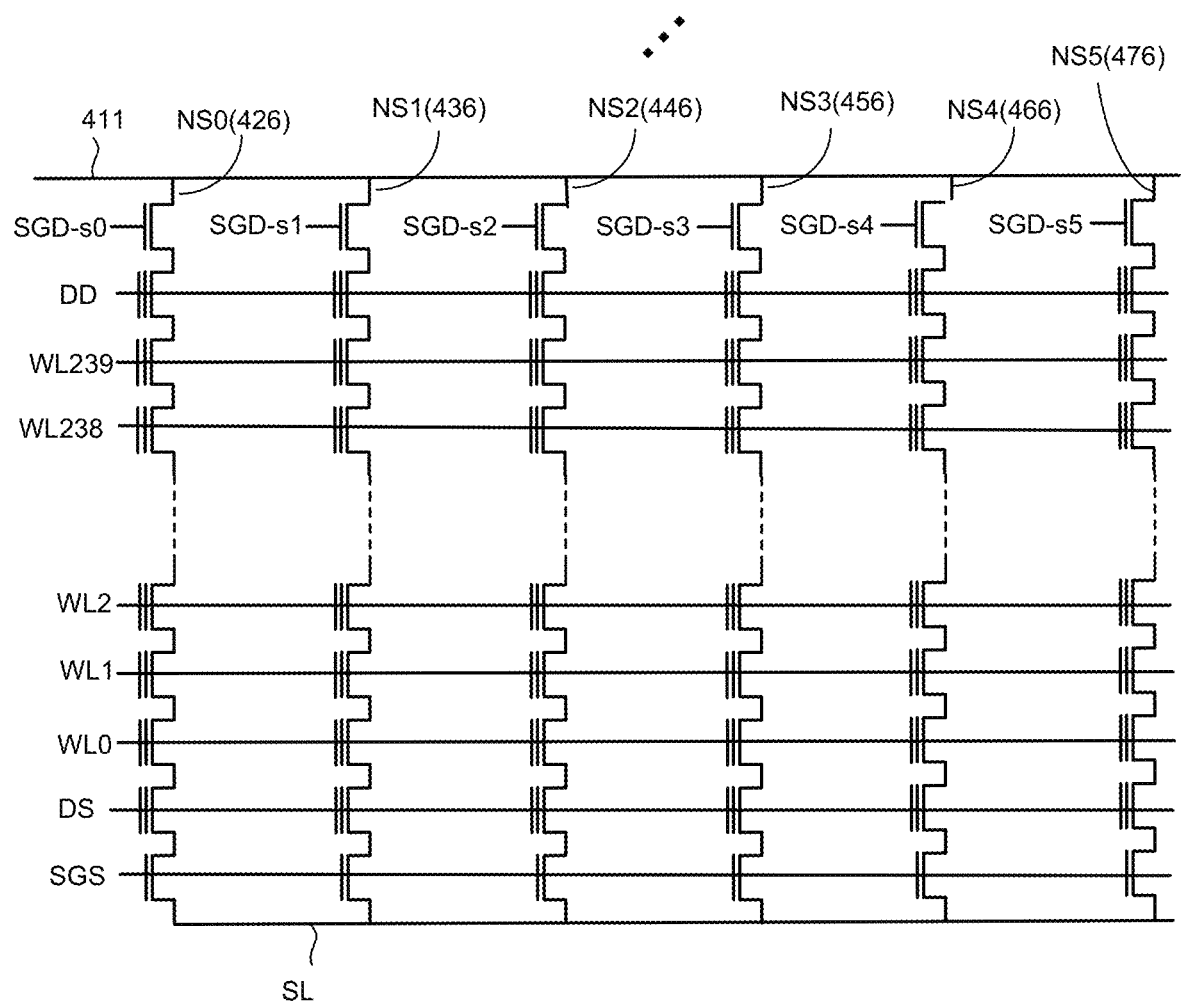
FIG. 4J is a schematic of a plurality of NAND strings in multiple sub-blocks of a same block.

FIG. 4J is a schematic diagram of a portion of the memory array 202 depicted in in FIGS. 4-4I. FIG. 4J shows physical data word lines WL0-WL239 running across the entire block. The structure of FIG. 4J corresponds to a portion 306 in Block 2 of Figure A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4E as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

Although the example memories of FIGS. 4-4J are three dimensional memory structure that includes vertical NAND strings with charge-trapping material, other (2D and 3D) memory structures can also be used with the technology described herein.

Figure 5A:
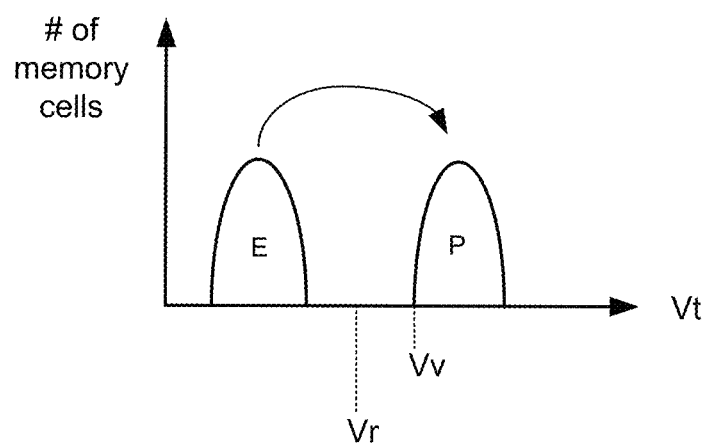
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read compare voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
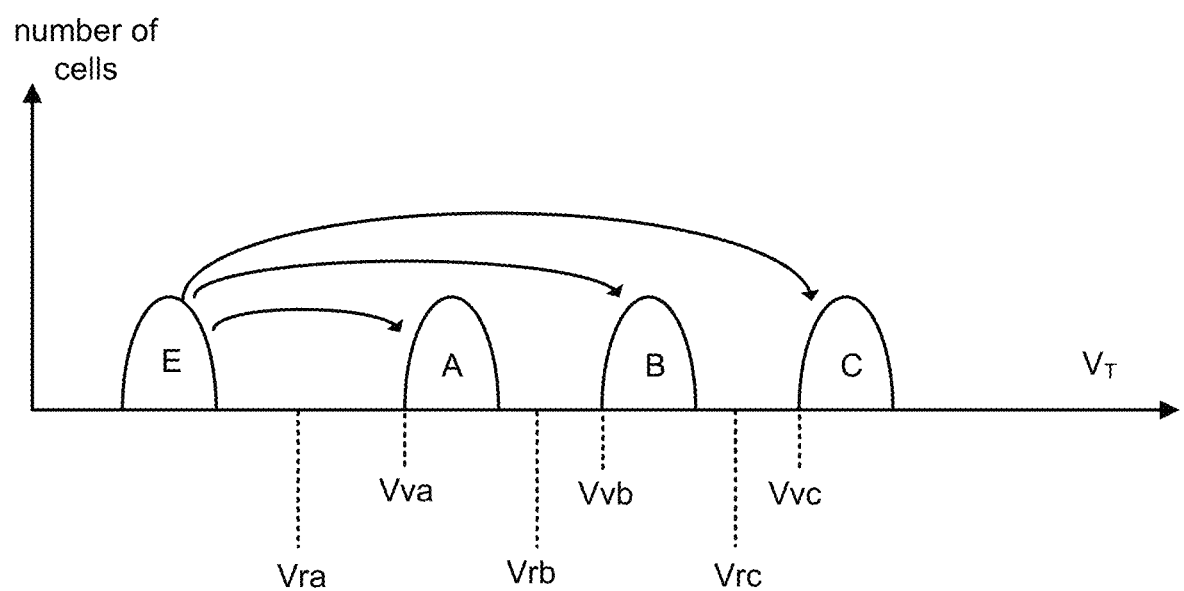
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

Figure 5C:
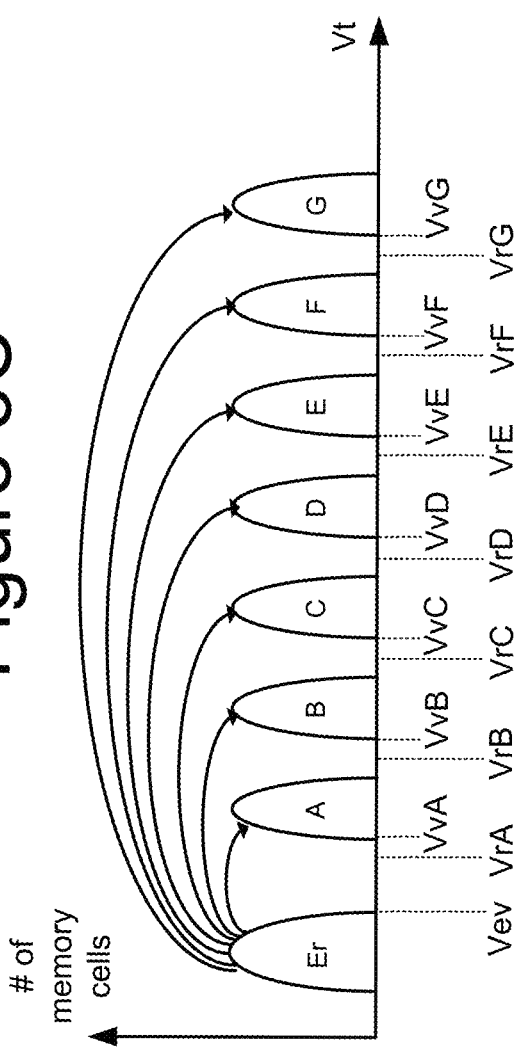
FIG. 5C depicts threshold voltage distributions.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|----|----|----|----|----|----|----|
| UP | 1 | 1 | 1 | 0 | 0 | 0 | 0 | 1 |
| MP | 1 | 1 | 0 | 0 | 1 | 1 | 0 | 0 |
| LP | 1 | 0 | 0 | 0 | 0 | 1 | 1 | 1 |

FIG. 5C shows seven read compare voltages, VrA, VrB, VrC, VrD, VrE, VrF, and VrG for reading data from memory cells. By testing (e.g., performing sense operations) whether the threshold voltage of a given memory cell is above or below the seven read compare voltages, the system can determine what data state (i.e., A, B, C, D, . . . ) a memory cell is in.

FIG. 5C also shows seven verify compare voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages VrA, VrB, VrC, VrD, VrE, VrF, and VrG, of FIG. 5C) or verify operation (e.g. see verify target voltages VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5D:
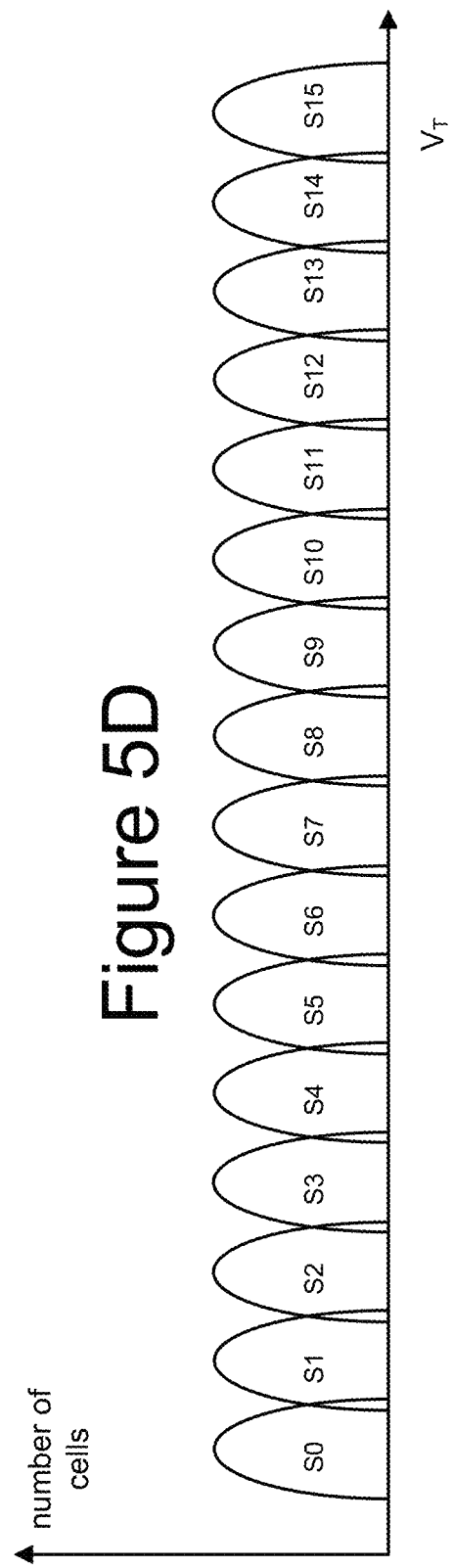
FIG. 5D depicts threshold voltage distributions.
Figure 5E:
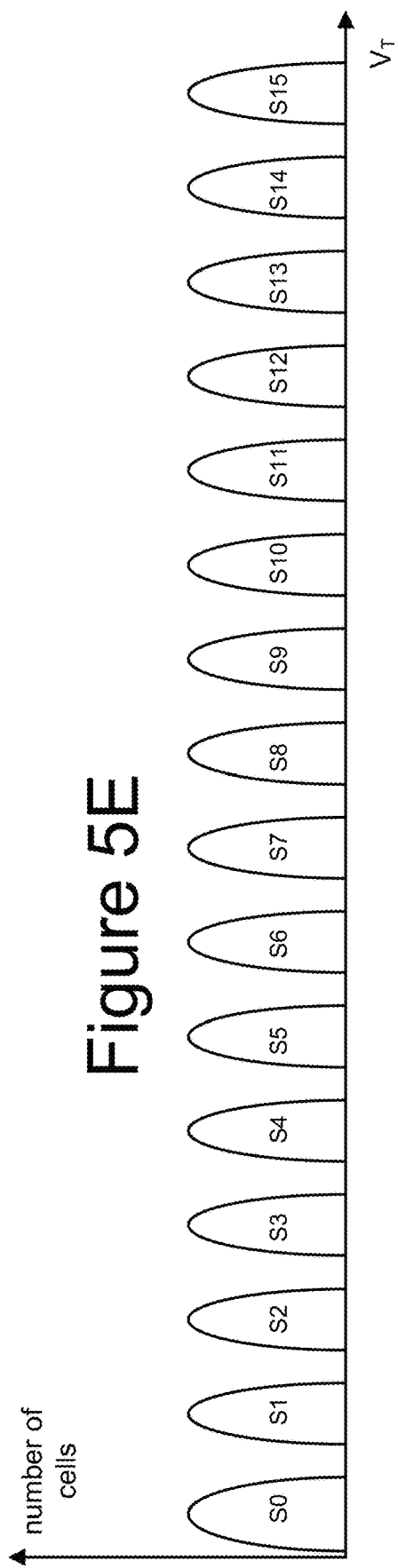
FIG. 5E depicts threshold voltage distributions.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read compare voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read compare voltages and verify compare voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 1  | 1  | 1  | 1   | 1   | 1   | 1   | 0   | 0   |
| MP | 1  | 1  | 1  | 0  | 0  | 0  | 1  | 1  | 0  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 5F:
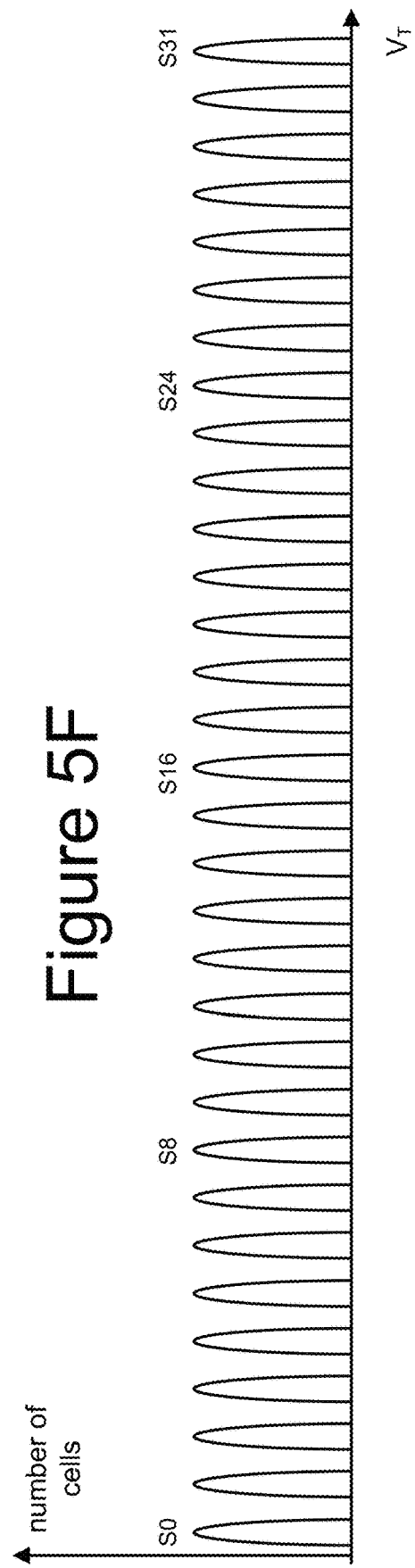
FIG. 5F depicts threshold voltage distributions.

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
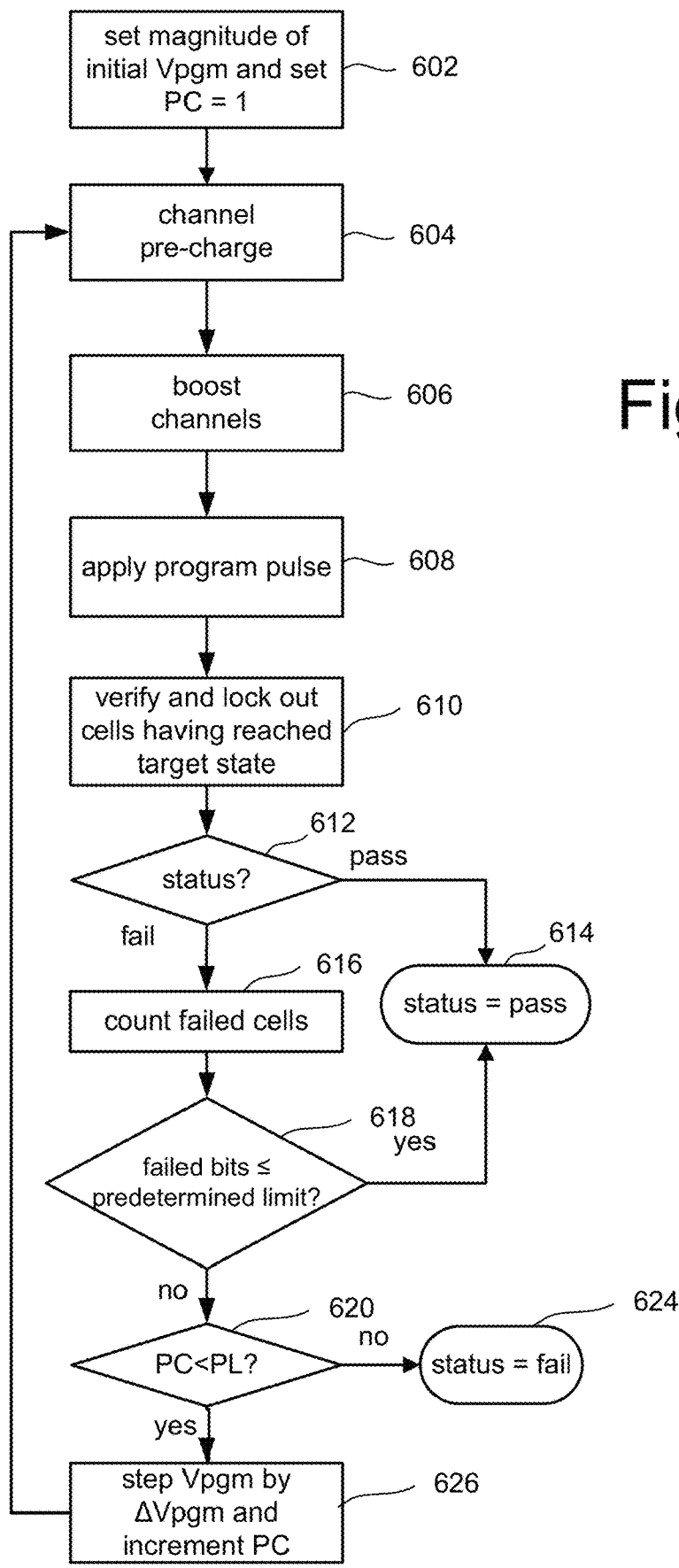
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-pass programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string. In one embodiment, for example, the channel is pre-charged to −2 volts in step 604 and then floated. In step 606, the channel is boosted up from the 2 volts to a boosting voltage of approximately 8-10 volts.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify compare levels. In one embodiment, the verification process is performed by testing whether the threshold voltages of the memory cells selected for programming have reached the appropriate verify compare voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In some embodiments, memory cells are programmed in an order from the source side to the drain side. For example, first the process of FIG. 6 is performed to program memory cells connected to WL0, followed by using the process of FIG. 6 to program memory cells connected to WL1, followed by using the process of FIG. 6 to program memory cells connected to WL2, followed by using the process of FIG. 6 to program memory cells connected to WL3, . . . followed by using the process of FIG. 6 to program memory cells connected to WL239.

In another embodiment, memory cells are programmed in an order from the drain side to the source side. For example, first the process of FIG. 6 is performed to program memory cells connected to WL239, followed by using the process of FIG. 6 to program memory cells connected to WL238, followed by using the process of FIG. 6 to program memory cells connected to WL237, followed by using the process of FIG. 6 to program memory cells connected to WL236, . . . followed by using the process of FIG. 6 to program memory cells connected to WL1, followed by using the process of FIG. 6 to program memory cells connected to WL0.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7:
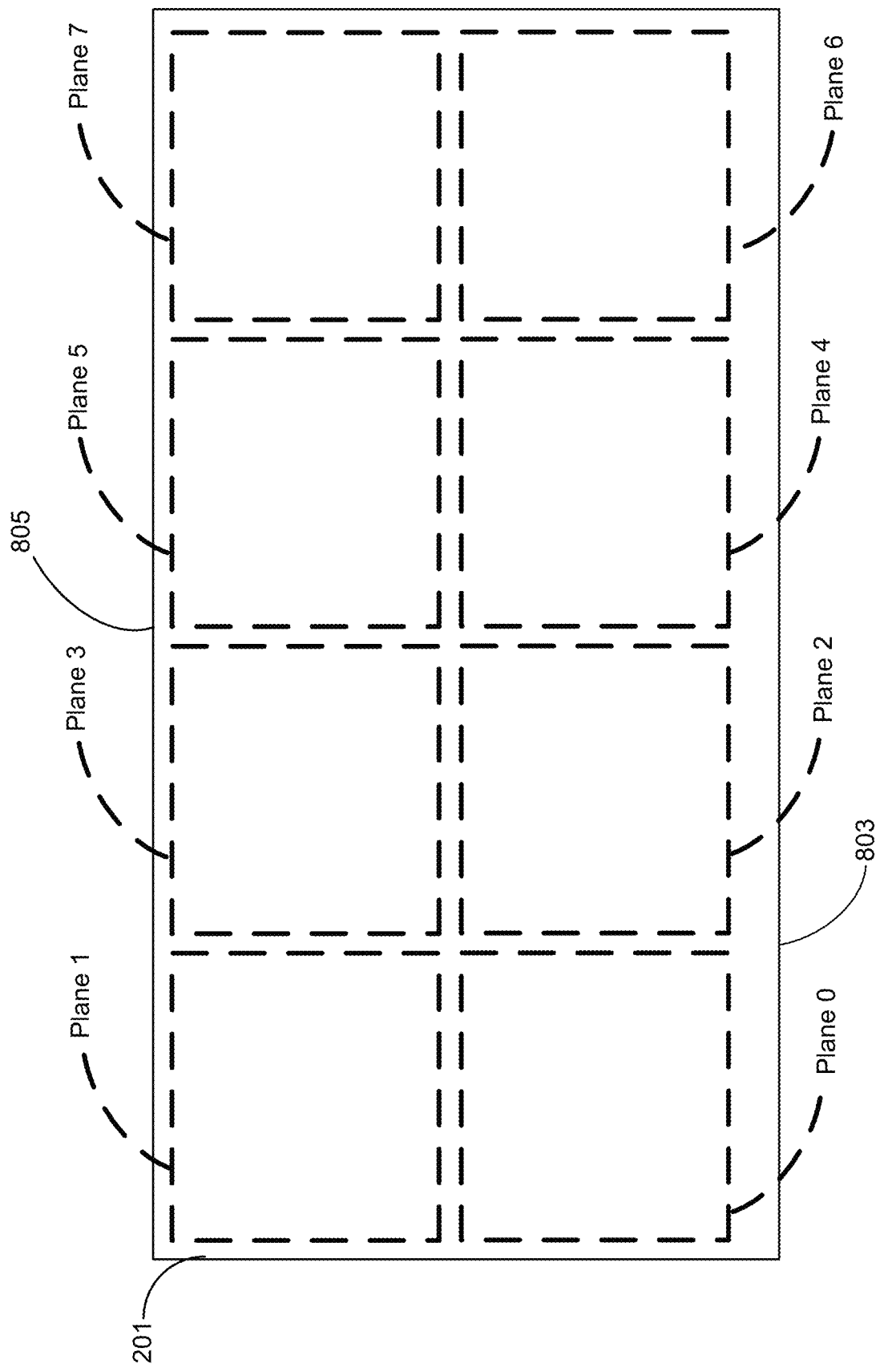
FIG. 7 is a top view of the planes of a memory die.

FIG. 7 depicts a top view of a memory die 201 of an integrated memory assembly 207 that includes eight planes: Plane 0, Plane 1, Plane 2, Plane 3, Plane 4, Plane 5, Planer 6 and Plane 7. In other embodiments, more or less than eight planes can be implemented. In one example implementation, each plane includes a three dimensional non-volatile memory array (or other type of memory structure). Each of the three dimensional non-volatile memory arrays includes bit lines and word lines connected to non-volatile memory cells, as described above.

Figure 8:
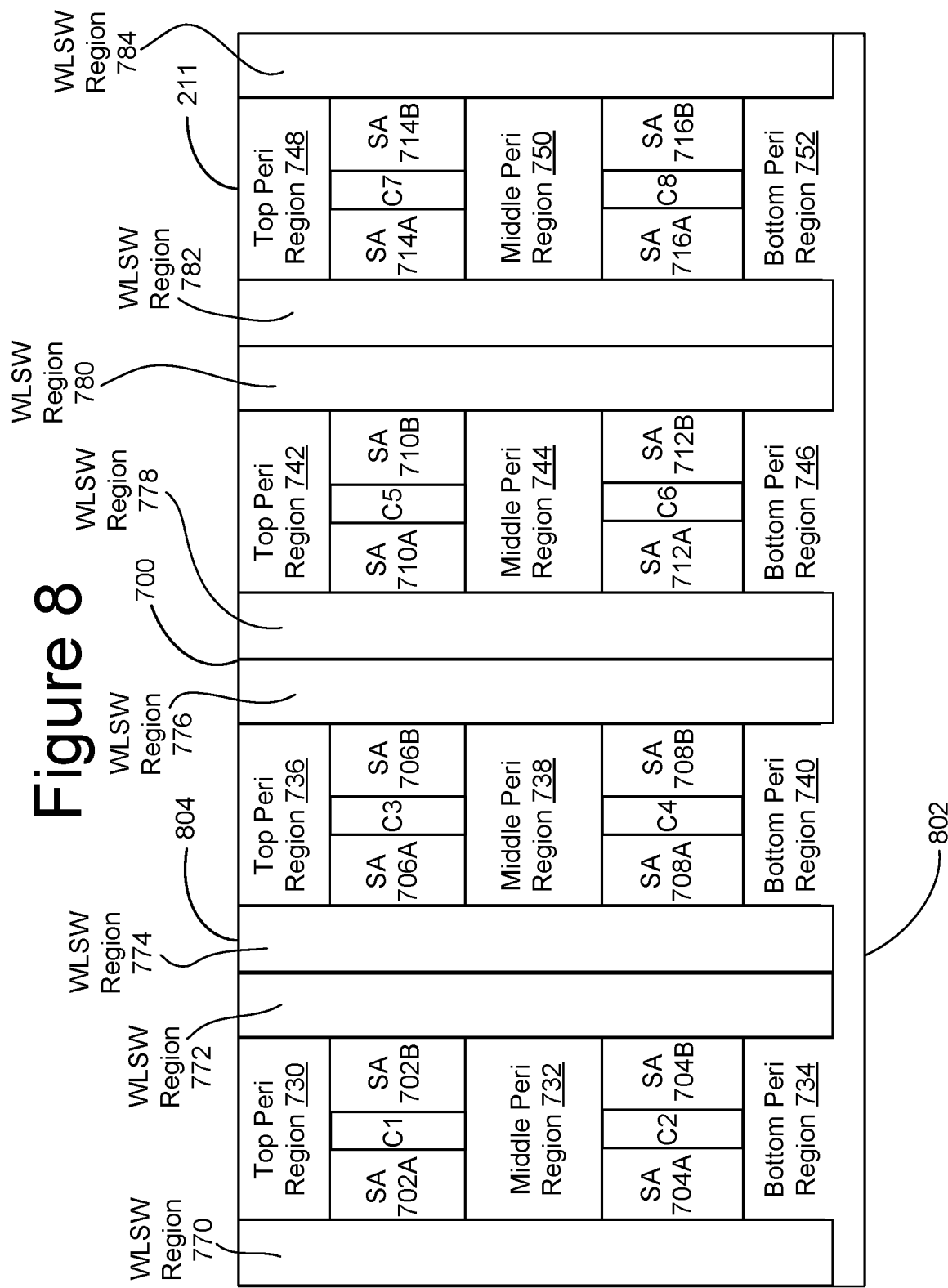
FIG. 8 is a top view of the circuits on a control die.

FIG. 8 depicts a top view of control die 211 of an integrated memory assembly 207. Particularly, FIG. 8 is looking down on the top surface of substrate 700 of control die 211. The top surface 700 of the substrate is divided into various areas including a plurality of word line switch regions 770, 772, 774, 776, 778, 780, 782 and 784. Each of these word line switch regions includes a plurality of word line switches that connect word lines to voltage sources. Control die 211 also includes a plurality of sense amplifier regions 702A, 702B, 704A, 704B, 706A, 706B, 708A, 708B, 710A, 710B, 712A, 712B, 714A, 714B, 716A and 716B. Each of the sense amplifiers regions includes sense amplifiers and supporting circuits. Control die 211 further includes a plurality of peripheral circuit regions (also referred to as Peri regions) 730, 732, 734, 736, 738, 740, 742, 744, 746, 748, 750 and 752. Each of the Peri regions includes various peripheral circuits (other than sense amplifiers and word line switch transistors) used to implement control die 211. For example, Peri regions 730, 732, 734, 736, 738, 740, 742, 744, 746, 748, 750 and 752 could include the components of system control logic 260, components of row control circuitry 220, and/or the components of column control circuitry 210 (except for sense amps 230) (see FIG. 2A and FIG. 2B). Control die 211 also includes other circuits C1-C8 between the sense amplifier regions.

Control die 802 has a first end 802, a second end 804 opposite the first end, and a middle that is between the first end and the second end. The Peri regions at the first end 802 are referred to as Bottom Peri regions (e.g., Bottom Peri Region 734, Bottom Peri Region 740, Bottom Peri Region 746, and Bottom Peri Region 752). The Peri regions at the second end 804 are referred to as Top Peri regions (e.g., Top Peri Region 730, Top Peri Region 736, Top Peri Region 742, and Top Peri Region 748). The Peri regions in the middle are referred to as Middle Peri regions (e.g., Middle Peri Region 732, Middle Peri Region 738, Middle Peri Region 744, and Middle Peri Region 750). Note that the memory die also has a corresponding first end 803, second end 805 opposite the first end, and a middle that is between the first end and the second end (see FIG. 7).

Figure 9:
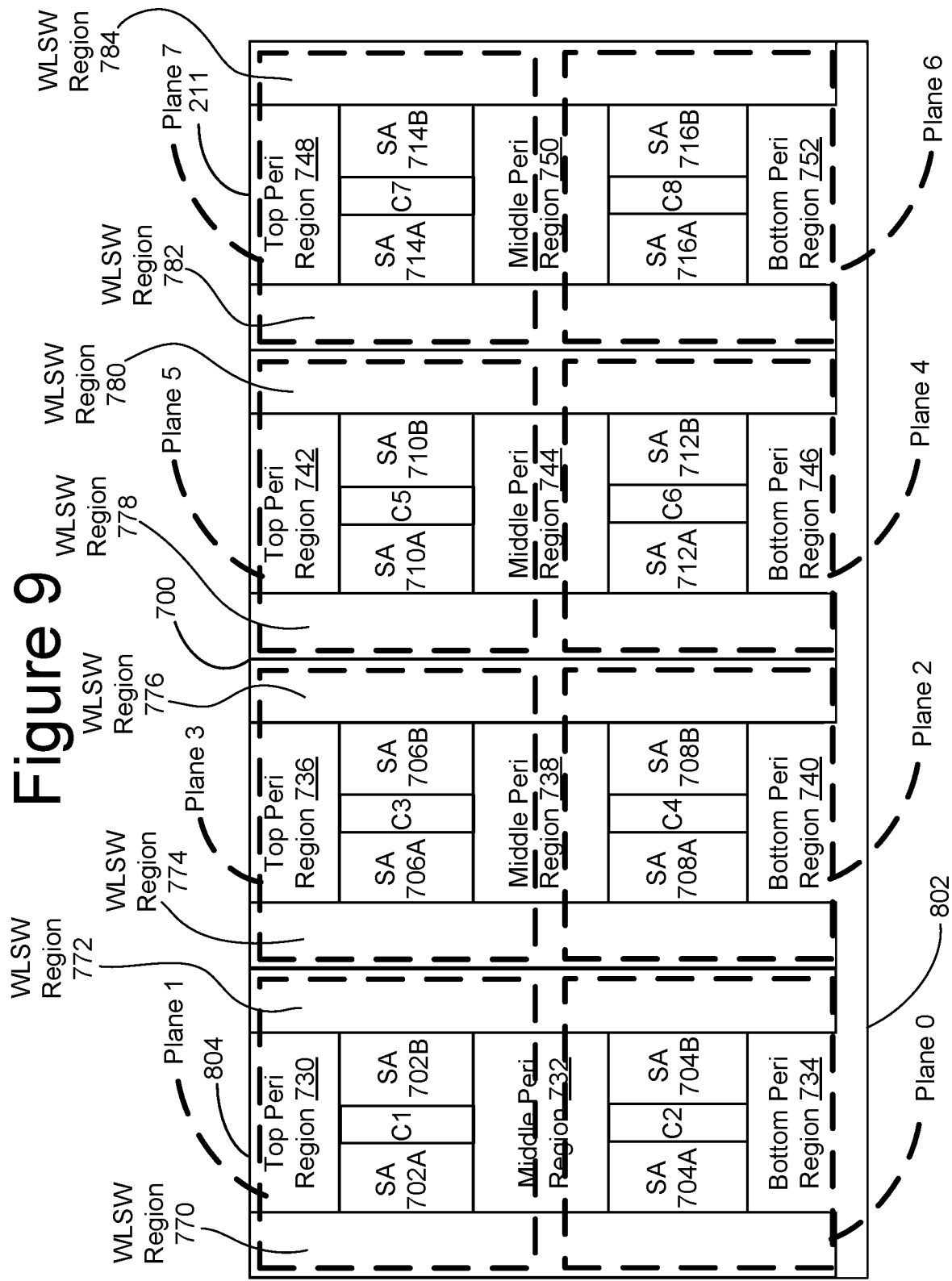
FIG. 9 is a top view of the circuits on a control die.

In one embodiment, control die 211 of FIG. 8 is positioned below memory die 201. That is, the eight planes depicted in FIG. 7 would be positioned above the components depicted in FIG. 8, as shown in FIG. 9.

Figure 10:
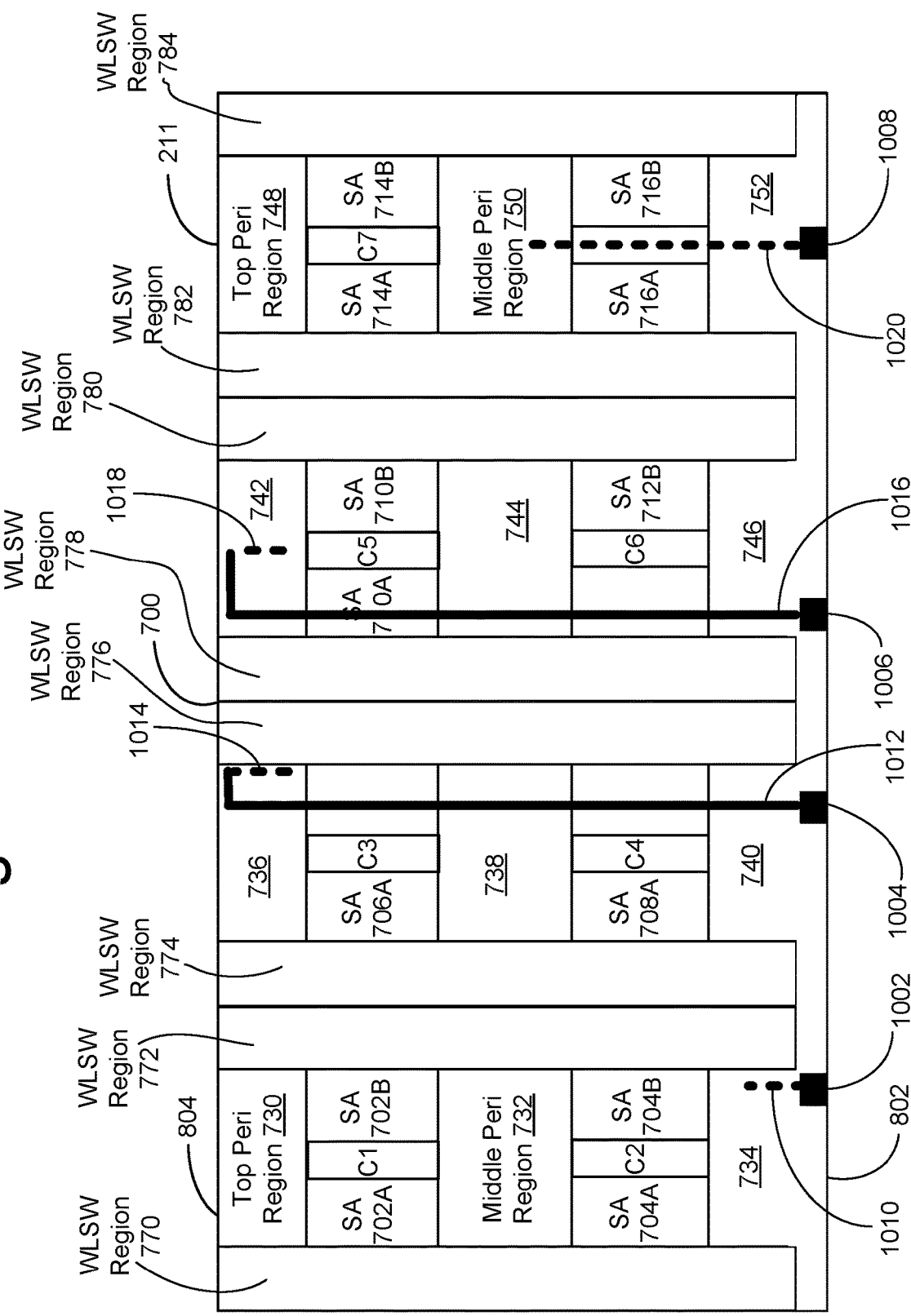
FIG. 10 is a top view of the circuits on a control die with a portion of a top metal layer superimposed above the circuits.

FIG. 10 depicts the top view of control die 211 and also shows a portion of a top metal layer of the memory die 201 superimposed above the circuits on the top surface of substrate 700 of control die 211. For example, FIG. 10 depicts Input/Output ("I/O") pads 1002, 1004, 1006 and 1008, which are positioned on a top surface of memory die 201, on the first end 803 of memory die 201. The I/O pads are intermediate structures connecting internal signals from the integrated circuit to the external pins or other interface of the integrated circuit. FIG. 10 also shows metal lines 1012 and 1016, both of which are part of a top metal layer M4 positioned above the memory arrays of memory die 201e (e.g., above Plane 0-Plane 7). Metal line 1012 extends across the integrated memory assembly (e.g., from ends 802/803 to ends 804/805). A metal interlayer segment connects metal line 1012 to a metal line 1014 of metal layer D4 (see FIG. 12) on control die 211, which connects to a circuit on the top surface of substrate 700 of control die 211 via three other metal layers. Metal line 1016 extends across the integrated memory assembly (e.g., from ends 802/803 to ends 804/805). A metal interlayer segment connects metal line 1016 to a metal line 1018 of metal layer D4 (see FIG. 12) on control die 211 which connects to a circuit on the top surface of substrate 700 of control die 211 via four other metal layers. A metal interlayer segment connects I/O pad 1002 to a metal line 1010 of metal layer D4 on control die 211, which connects to a circuit on the top surface of substrate 700 of control die 211 via three other metal layers. A metal interlayer segment connects I/O pad 1008 to a metal line 1020 of metal layer D4 on control die 211 which connects to a circuit on the top surface of substrate 700 of control die 211 via three other metal layers.

There is a trend to reduce the size of semiconductor dies, as consumers want the size of electronics to be small. There is also a trend to increase the functionality of semiconductor dies, as consumers want more features in their electronics. Adding more functionality typically results in the need for more signal lines (e.g., power, command and/or data) to be routed throughout the semiconductor. As more signal lines are routed within memory die and the control die, and the die are made smaller, congestion of the signal lines will occur such that it is not possible to include all of the signal limes needed to implement all of the desired functions, unless the die are made bigger.

To resolve the congestion of the signal lines that can occur in semiconductor memory, without increasing the size of the die, it is proposed to include metal interlayer segments between memory structures of a memory die such that the metal interlayer segments communicate from above the memory structures to below the memory structure.

Figure 11:
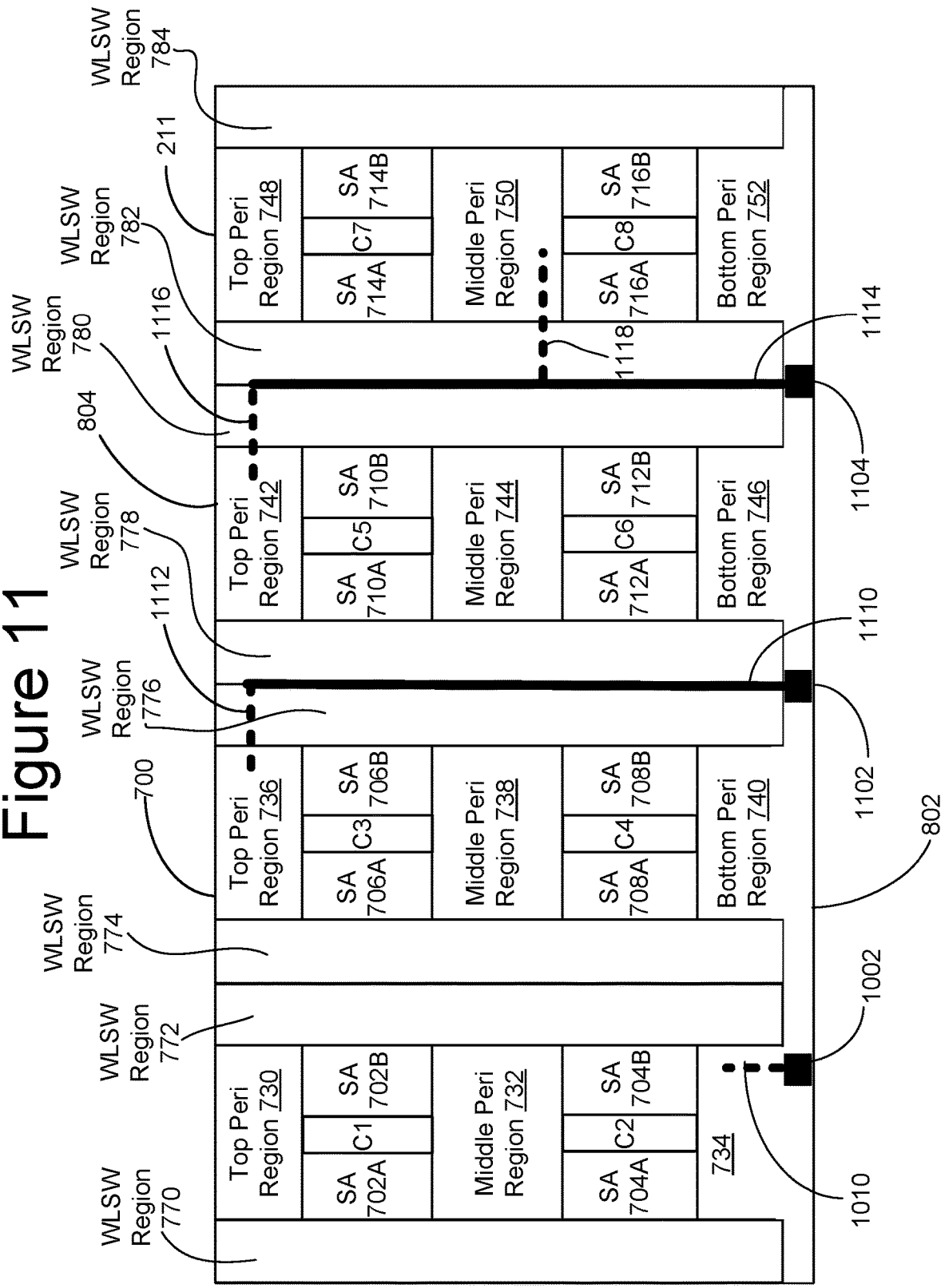
FIG. 11 is a top view of the circuits on a control die with a portion of a top metal layer superimposed above the circuits.

FIG. 11 depicts the top view of control die 211 and also shows a portion of another embodiment of a top metal layer of memory die 201 superimposed above the circuits on the top surface of substrate 700 of control die 211. The embodiment of FIG. 11 includes metal interlayer segments between memory structures in order to alleviate the above-described congestion of signal lines. FIG. 11 depicts I/O pads 1002, 1102, and 1108, which are actually positioned on a top surface of memory die 201, on the first end 803 of memory die 201. FIG. 11 also shows metal lines 1110 and 1114, both of which are part of a top metal layer M4 (See also FIG. 12) positioned above the memory arrays of memory die 201 (e.g., above Plane 0-Plane 7). Metal lines 1110 and 1114 extend across the integrated memory assembly (e.g., from ends 802/803 to ends 804/805). A metal interlayer segment (not depicted in FIG. 11), positioned in a gap between Plane 3 and Plane 5, connects metal line 1110 to a metal line 1112 of metal layer D3 on control die 211 which connects to a circuit of Top Peri Region 736 on the top surface of substrate 700 of control die 211 via three other metal layers. A metal interlayer segment (not depicted in FIG. 11), positioned in a gap between Plane 5 and Plane 7, connects metal line 1114 to a metal line 1116 of metal layer D2 (or D3) on control die 211 which connects to a circuit of Top Peri Region 742 on the top surface of substrate 700 of control die 211 via three other metal layers. A metal interlayer segment (not depicted in FIG. 11), positioned in a gap between Plane 4 and Plane 6, connects metal line 1114 to a metal line 1118 of metal layer D2 (or D3) on control die 211 which connects to a circuit of Middle Peri Region 742 on the top surface of substrate 700 of control die 211 via three other metal layers.

Metal lines 1110 and 1114 of the top metal layer M4 extend across the memory die 201, are directly on top of the gaps between Planes (see discussion below), and extend parallel to the gaps. Metal lines 1110 and 1114 of the top metal layer are configured to carry one of a global power signal, global data signal, and a global command signal to one or more circuits on the surface of the substrate of control die 201. For example, metal line 1114 is configured to carry one of a global power signal, global data signal, and a global command signal to circuits of the Top Peri Region 742 (via metal line 1116 of metal layer D2) and the Middle Peri Region 750 (via metal line 1118 of metal layer D2).

Figure 12:
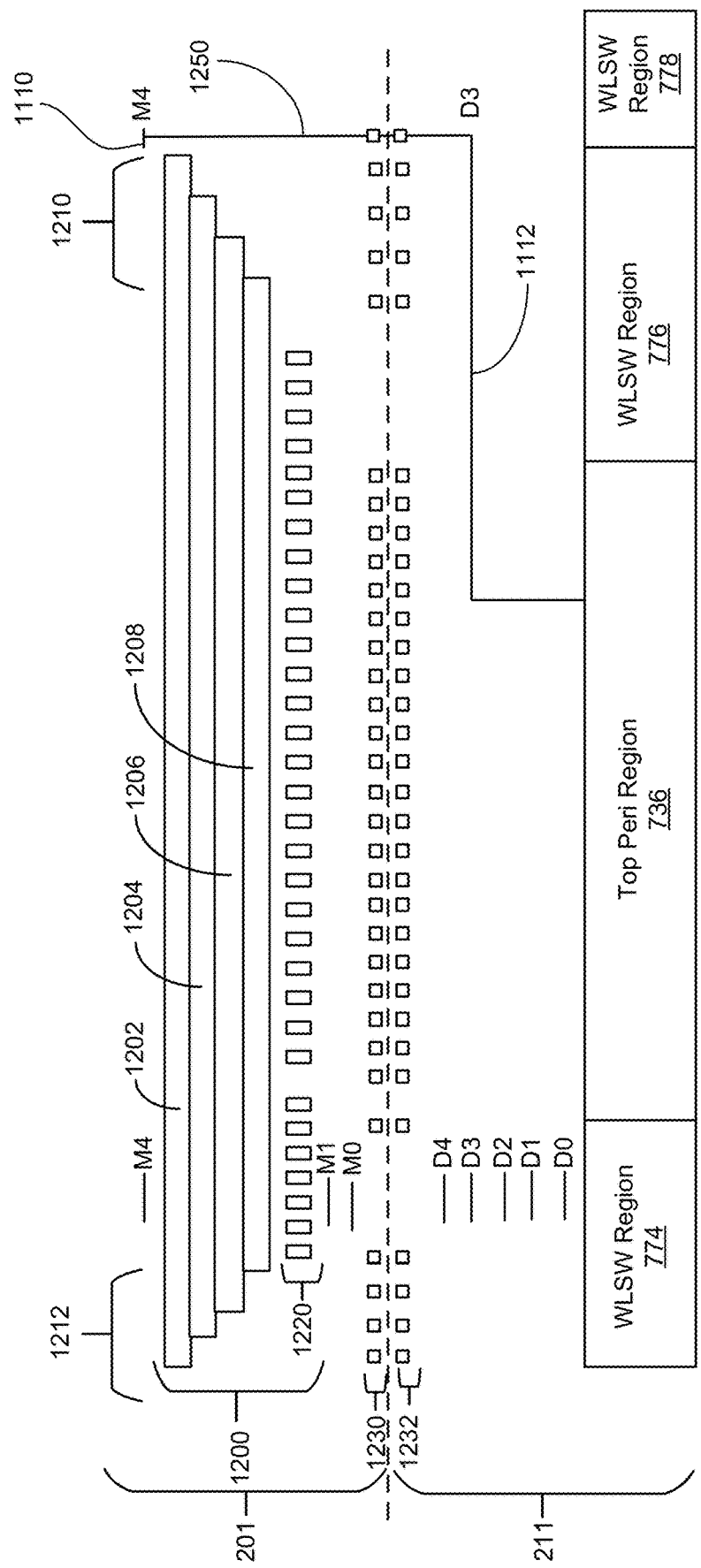
FIG. 12 is a cross section of an integrated memory assembly.

FIG. 12 is a cross section of integrated memory assembly 207, corresponding to the structure of FIG. 11, that includes cross sections of memory die 201 and control die 211. The portion of memory die 201 depicted in the cross section in FIG. 12 comprises a non-volatile memory array 1200 forming Plane 3, which includes a plurality of word lines 1202, 1204, 1206, and 1208. Only four word lines are depicted to make the drawing easier to read; however, in most embodiments more than four word lines would be implemented. To make the drawing easier to read, FIG. 12 does not show the dielectric regions between the word lines or the vertical columns that implement NAND strings. Thus, the non-volatile memory array 1200 includes having a stack of alternating conductive and dielectric layers as described above with respect to FIGS. 4C-4F. Below the word lines are a plurality of bit lines 1220. Below bit lines 1220 are a set of bond pads 1230 for memory die 201. Below the memory array/plane 1200 and above the bond pads 1230 are two metal line layers referred to as M0 and M1. Above the memory array/plane 1200 is a metal line layer referred to as M4. FIG. 12 only shows a portion of M4 corresponding to metal line 1110 (in the direction coming out of the page).

Control die 211 includes substrate 700. The portion of substrate 700 depicted in FIG. 12 includes word line switch region 774, word line switch region 776, word line switch region 778, and Top Peri region 736. Control die 211 also includes a plurality of bond pads 1232 that line up with bond pads 1230 in order to bond control die 211 to control die 201. That is, in one embodiment, each (or a subset) of bond pads 1232 is bonded to a corresponding and aligned bond pad of plurality bond pads 1230 and allows for transmission of signals between memory die 201 and control die 211. Below bond pads 1232 (and below the memory arrays/Plane of memory die 201) and above substrate 700 are a plurality of metal line layers, including D0, D1, D2, D3 and D4.

As can be seen from FIG. 12, the word lines (1202, 1204, 1206, and 1208) form an inverted staircase structure such that word line length increases from bottom to top of the three dimensional non-volatile memory structure. For example, the two edges of the stack of word lines (1202, 1204, 1206, and 1208) are in the shape of an inverted staircase. For purposes of this document, the inverted staircase structure can be referred to as a staircase. Memory array 1200 (Plane 3) includes staircase 1210 at one edge of memory array 1200 (Plane 3) and staircase 1212 at another edge of memory array 1200 (Plane 3).

Figure 13:
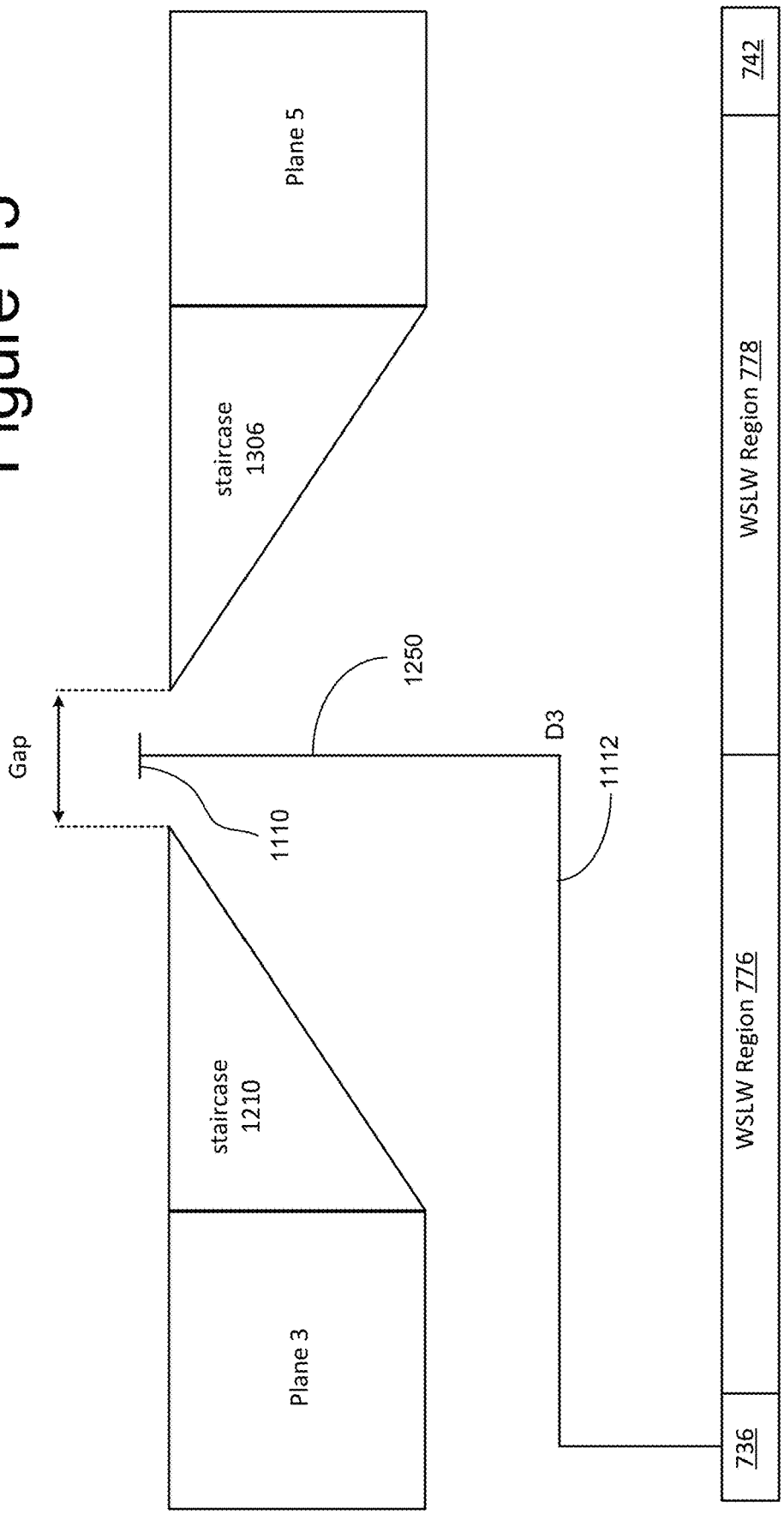
FIG. 13 is a cross section of an integrated memory assembly.

Each of the Planes (Plane 0, Plane 1, . . . Plane 7) includes a staircase at one edge Plane and a staircase at a second edge of the Plane. Thus, adjacent Planes (e.g., memory arrays or other types of memory structures) will have adjacent staircases (where the staircases comprises a stack of alternating conductive word line layers and dielectric layers between the word line layers as depicted in FIGS. 4C-4F). This is depicted in FIG. 13, which is a block diagram that shows Plane 3 having staircase 1210 and Plane 5 (which is adjacent to Planes 3 and 7) having staircase 1306. Staircase 1210 faces Plane 5, staircase 1306 faces plane 3, and staircase 1306 and 1210 face each other. Planes 3 and 5 (including their staircases) are positioned above Top Peri Region 736, word line switch region 776, word line switch region 778, and Top Peri region 742. FIG. 13 shows a gap between Plan 3 and Plane 5 (and between staircases 1210 and 1306). Staircases 1210 and 1306 are on opposite sides of the gap. Metal line 1110 of top metal layer M4 is positioned above the gap (and parallel to the gap). Metal interlayer segment 1250 is positioned in the gap, positioned between the staircase 1210 and staircase 1306, and connected to metal line 1110 of top metal layer M4 and a signal line 1112 of metal layer D3.

Figure 14:
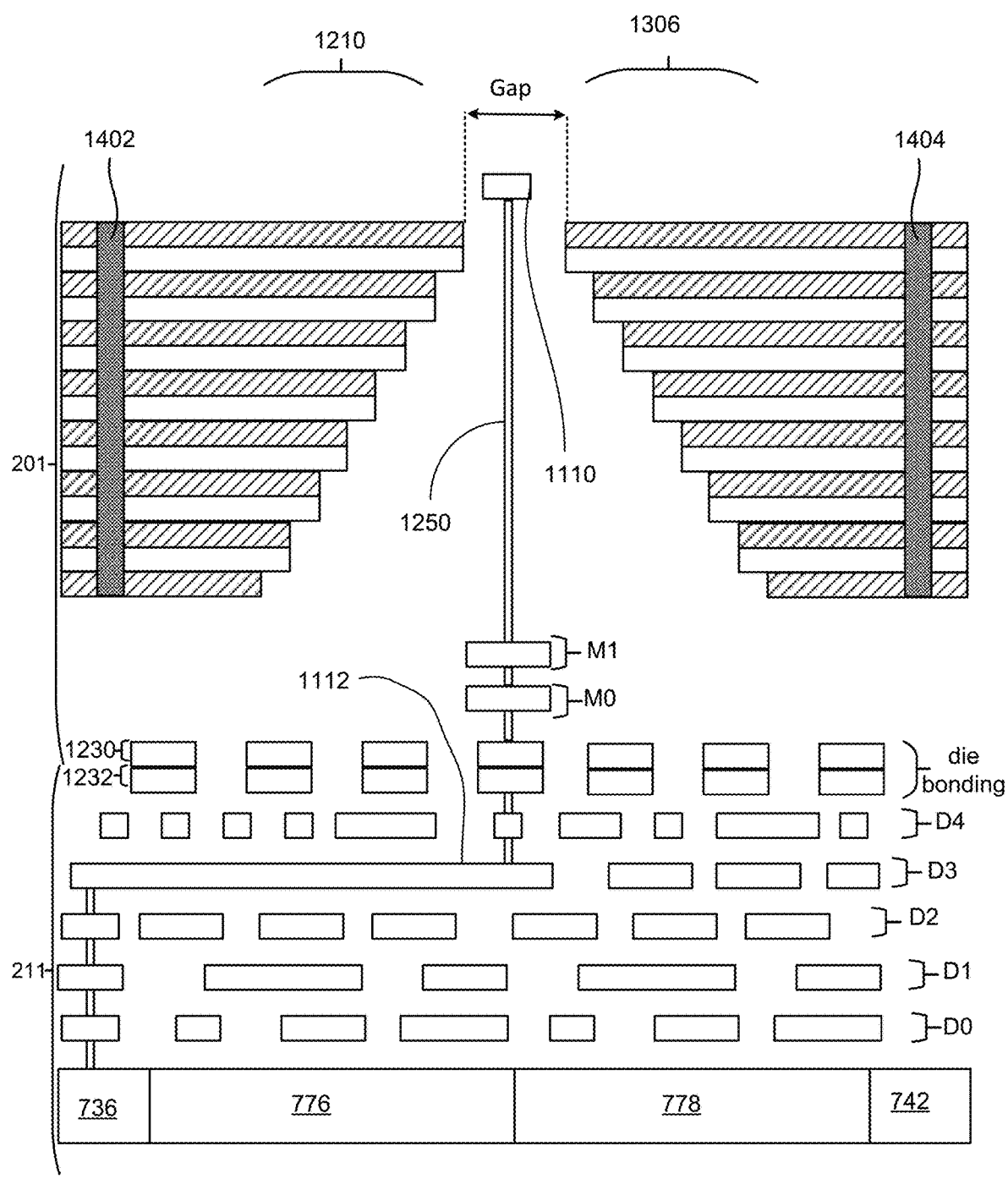
FIG. 14 is a cross section of an integrated memory assembly.

FIG. 14 is a cross section that shows metal line 1110 of top metal layer M4 positioned above the gap between staircase 1210 of Plane 3 and staircase 1306 of Plane 5, with metal interlayer segment 1250 positioned in the gap, connected to signal line 1110 of top metal layer M4, and connected to signal line 1112 of metal layer D3 via metal layer M1, metal layer M0, bond pad 1230, bond pad 1232, and metal layer D4. FIG. 14 also depicts vertical column 1402 of Plane 3 and vertical column 1404 of Plane 5, such that vertical columns 1402 and 1404 implement NAND strings, as discussed above. In one embodiment, metal interlayer segment 1250 is made from Tungsten, top metal layer M4 is Aluminum, M0/M1 are Copper, D0/D1/D2 are Tungsten, and D3/D4 are Copper.

Like FIGS. 13 and 14, FIG. 12 shows signal line 1110 of top metal layer M4 positioned above Plane 3 and Plane 5, and metal interlayer segment 1250 positioned in the gap and connected to signal line 1110 of top metal layer M4. FIG. 12 also shows control die 211 physically connected to memory die 202 via bond pads 1230/1232, where control die 211 includes signal line 1112 of metal layer D3 from metal interlayer segment 1250 to one or more electrical circuits of Top Peri Region 736. In one embodiment, signal line 1112 of metal layer D3 is connected to the metal interlayer segment 1250 via bottom metal layers M1 and M0, bond pads 1230 (an interface), bond pads 1232 (an interface), and metal layer D4. In one embodiment, signal line 1112 of metal layer D3 is connected to the one or more electrical circuits of Top Peri Region 736 via metals layers D2, D1 and D0. An electrical pathway exists from signal line 1110 of top metal layer M4 through the metal interlayer segment 1250 to the bottom metal layers M1 and M0, to the top metal layer D4 via the an interface (bond pad 1230) and a second interface (band pad 1232), to signal line 1112 of metal layer D3 via metal layer D4, along signal line 1112 of metal layer D3 to the one or more electrical circuits of Top Peri Region 736 via metals layers D2, D1 and D0.

Considering FIGS. 7, and 11-14 together, in one embodiment, the memory die has a first end 803 and a second end 805 opposite the first end 803, the memory die has a middle that is between the first end and the second end 805, the control die has a first end 802 corresponding in location to the first end 803 of the memory die, the control die has a second end 804 corresponding in location to the second end 805 of the memory die, the control die has a middle that is between the first end 802 and the second end 804, signal line 1110 of top metal layer M4 runs from the first end 803 of the memory die to the second end 805 of the memory die, top metal layer M4 connects to I/O pads at the first end 803 of the memory die including signal line 1110 of top metal layer M4 connecting to I/O pad 1102 at the first end 803 of the memory die, and metal interlayer segment 1250 is positioned at and connects to the top metal layer M4 (e.g., connect to signal line 1110) at the second end 805 of the memory die. An electrical pathway runs from signal line 1110 of top metal layer M4 to metal interlayer segment 1250, to bond pad 1230, to bond pad 1232, to signal line 1112 of metal layer D3 (via D4) and then to the one or more electrical circuits of Top Peri Region 736 via metals layers D2, D1 and D0 at the second end 804 of the control die.

With respect to metal line 1114 of the top metal layer M4 and metal line 1118 of metal layer D2, an electrical pathway exists from signal line 1114 of top metal layer M4 through a metal interlayer segment (not depicted) positioned in a gap between Planes 4 & 6, to bottom metal layers M1 and M0, to the top metal layer D4 via the a interface (bond pads 1230) and a second interface (band pads 1232), to signal line 1118 of metal layer D2 via metal layers D4 & D3, along signal line 1118 of metal layer D2 to the one or more electrical circuits of Middle Peri Region 750 via metals layers D1 and D0. The electrical pathway runs from a bond pad 1232 to signal line 1118 of metal layer D2 and then to the one or more electrical circuits of Middle Peri Region 750 via metals layers D1 and D0 at the middle of the control die. In regard to the one or more electrical circuits of Middle Peri Region 750, the control die 211 includes a substrate and sense amplifiers (e.g., 714A, 714B, 716A and 716B) positioned on the substrate, such the one or more electrical circuits of Middle Peri Region 750 are positioned between sense amplifiers.

Note that the memory die comprises additional Planes each having additional staircases with additional gaps between the additional staircases and between the Planes, and additional metal interlayer segments positioned in the additional gaps and connecting to the first top metal layer.

Figure 15:
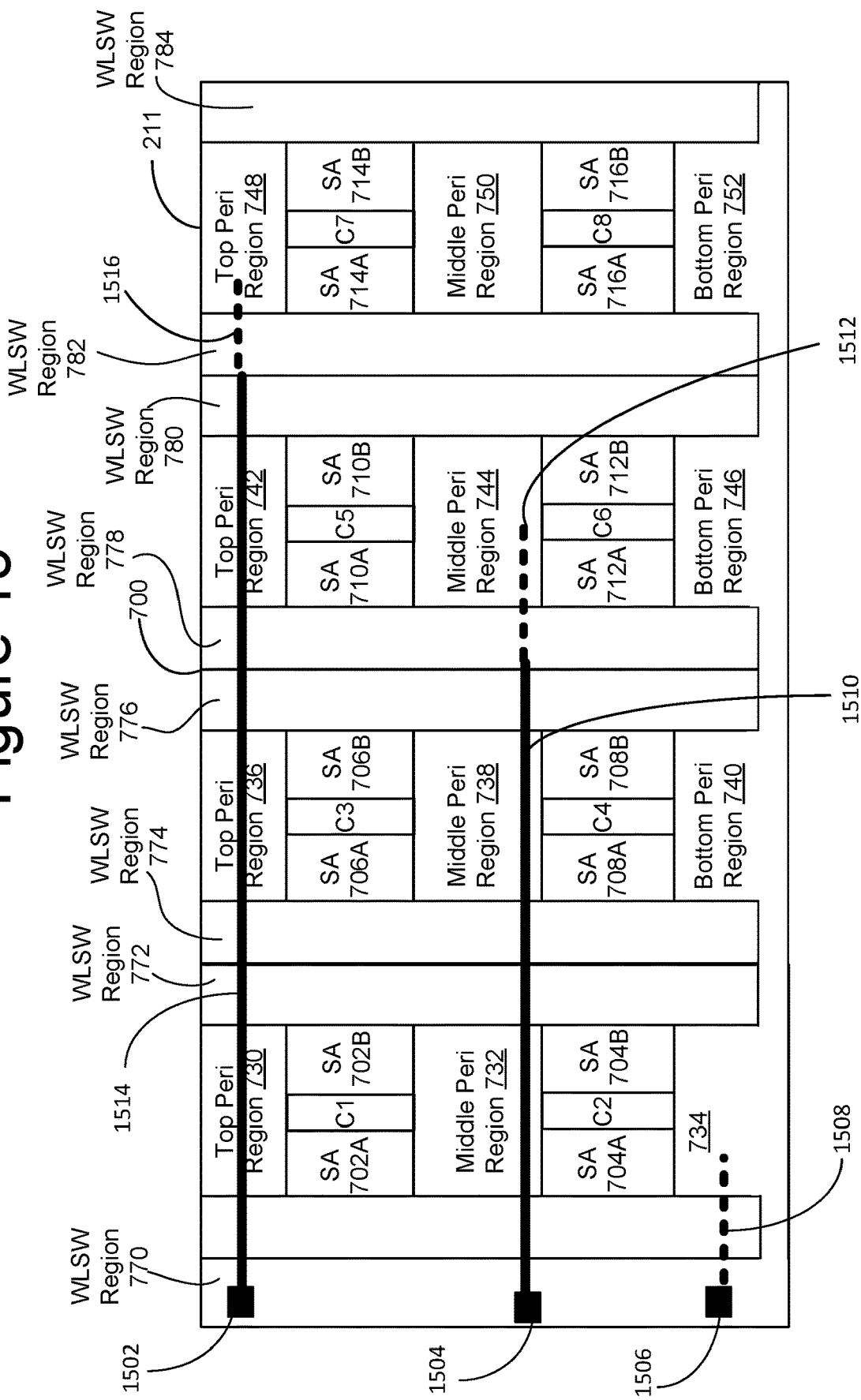
FIG. 15 is a top view of the circuits on a control die with a portion of a top metal layer superimposed above the circuits.

FIG. 15 is a top view of the circuits on a control die with a portion of a top metal layer superimposed above the circuits. The embodiment of FIG. 15 has a different orientation for the I/O pads and metal lines of top metal layer M4. I/O pads 1502, 1504 and 1506 are along a left hand side of the top surface of memory die 201. Metal line 1508 of D4, which is connected to I/O pad 1506 via a metal interlayer segment that is not depicted in FIG. 15, connects to one or more circuits of Bottom Peri Region 734.

FIG. 15 also shows metal lines 1510 and 1514, both of which are part of a top metal layer M4 positioned above the memory arrays of memory die 201 (e.g., above Plane 0-Plane 7). Metal lines 1510 and 1514 extend across the integrated memory assembly. A metal interlayer segment (not depicted in FIG. 15), positioned in a gap between Plane 5 and Plane 7, connects metal line 1524 of M4 to a metal line 1516 of metal layer D3 on control die 211 which connects to a circuit of Top Peri Region 748 on the top surface of substrate 700 of control die 211 via three other metal layers. A metal interlayer segment (not depicted in FIG. 11), positioned in a gap between Plane 2 and Plane 4, connects metal line 1510 of M4 to a metal line 1512 of metal layer D2 on control die 211 which connects to one or more circuits of Middle Peri Region 744 on the top surface of substrate 700 of control die 211 via two other metal layers.

In the embodiment of FIG. 15, metal lines 1514 and 1510 of the top metal layer M4 are connected to I/O pads at a first side on the top surface of the memory die 201, extend across the memory die 201, are directly on top of at least a portion of the gap(s) and extend perpendicular to the gap(s).

Figure 16:
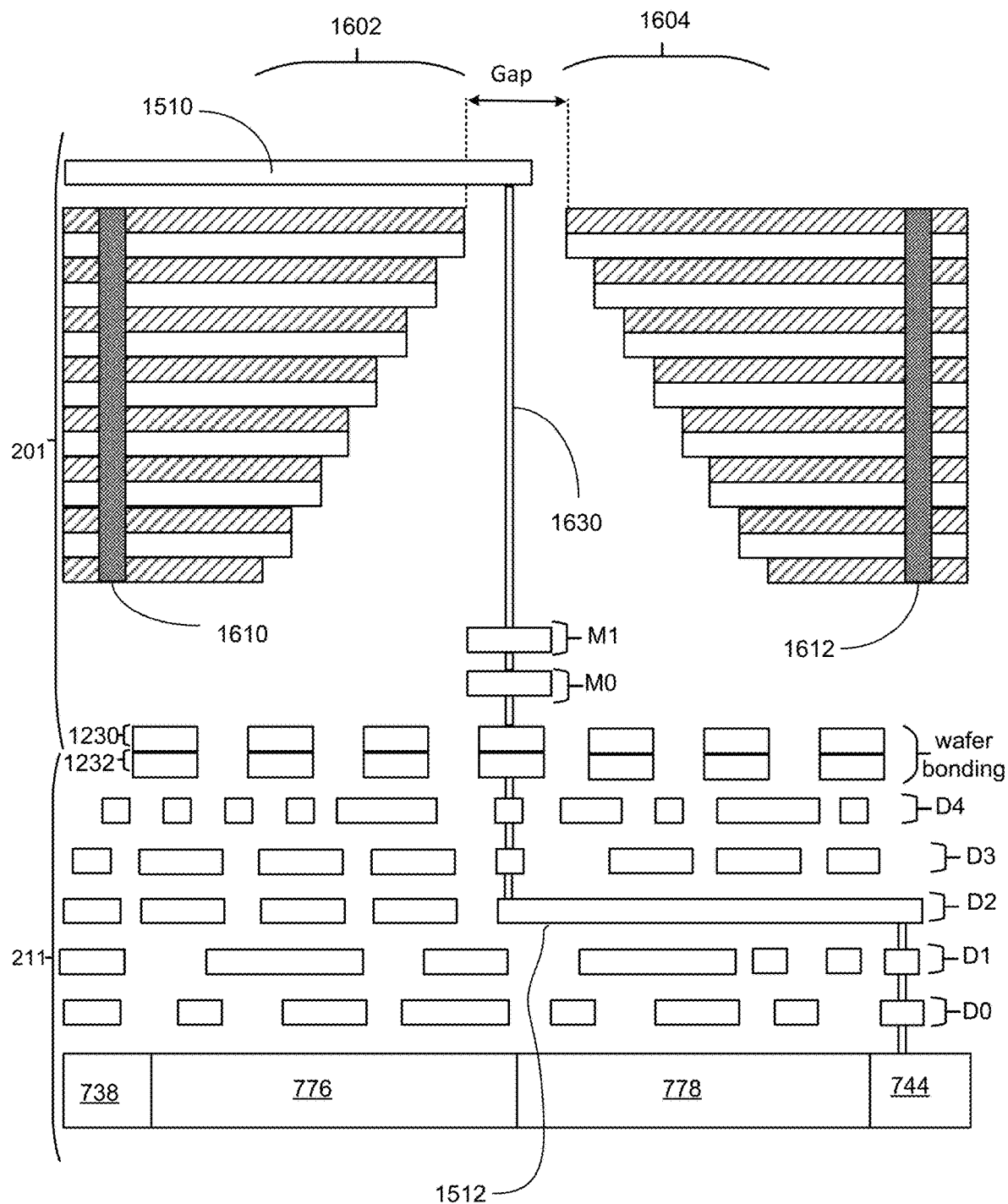
FIG. 16 is a cross section of an integrated memory assembly.

FIG. 16 is a cross section of an integrated memory assembly corresponding to the structure of FIG. 15. FIG. 16 shows a gap between staircase 1602 of Plane 2 and staircase 1604 of Plane 4. Plane 2 is depicted to include vertical column 1610 (which implements a vertical NAND string) and Plane 4 is depicted to include vertical column 1612 (which implements a vertical NAND string). Metal line 1510 of M4 connects to metal interlayer segment 1630, which is positioned in the gap between staircases and between planes. Metal interlayer segment 1630 also connects to metal layer M1. An electrical path exists from metal line 1510 of M4, to metal interlayer segment 1630, to M1, to M0, to D4 via bond pad 1230 and bond pad 1232, to D3, to metal line 1512 of metal layer D2, to D1 to D0 to one or more electrical circuits of Middle Peri Region 744 on the top surface of substrate 700 of control die 211.

Figure 17:
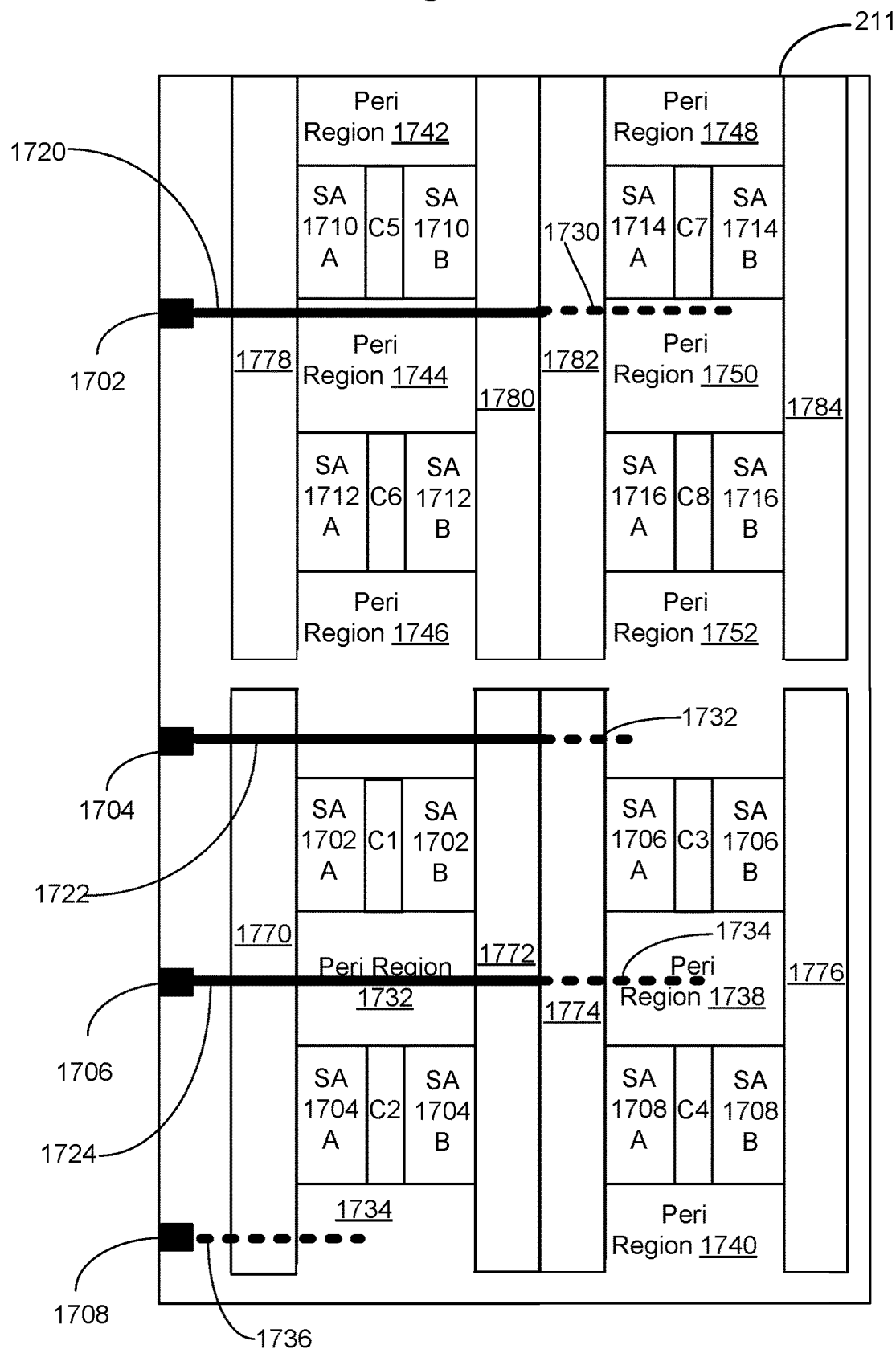
FIG. 17 is a top view of the circuits on a control die with a portion of a top metal layer superimposed above the circuits.

FIG. 17 is a top view of the circuits on a control die with a portion of a top metal layer superimposed above the circuits for another embodiment with a different orientation. In the embodiment of FIG. 17, the top surface 700 of the substrate of control die 211 is divided into various areas including a plurality of word line switch regions 1770, 1772, 1774, 1776, 1778, 1780, 1782 and 1784. Each of these word line switch regions includes a plurality of word line switches that connect word lines to voltage sources. Control die 211 also includes a plurality of sense amplifier regions 1702A, 1702B, 1704A, 1704B, 1706A, 1706B, 1708A, 1708B, 1710A, 1710B, 1712A, 1712B, 1714A, 1714B, 1716A and 1716B. Each of the sense amplifiers regions includes sense amplifiers and supporting circuits. Control die 211 further includes a plurality of peripheral circuit regions (also referred to as Peri regions) 1732, 1734, 1738, 1740, 1742, 1744, 1746, 1748, 1750, and 1752. Each of the Peri regions includes various peripheral circuits (other than sense amplifiers and word line switch transistors) used to implement control die 211. C1-C8 include additional circuits positioned between sense amplifiers.

FIG. 17 shows metal line 1720 of metal layer M4 connected to I/O pad 1702, extending across the top surface of memory die 201, directly on top of at least a portion of the gap(s) between Planes/staircases and extending perpendicular to the gap(s). Metal line 1730 of D2 or D3 connects metal line 1720 to one or more circuits of Peri Region 1750 via a metal interlayer segment (not depicted) positioned in the gap between Planes/staircases. Metal line 1722 of metal layer M4 connected to I/O pad 1704, extending across the top surface of memory die 201, directly on top of at least a portion of the gap(s) between Planes/staircases and extending perpendicular to the gap(s). Metal line 1733 of D2 or D3 connects metal line 1722 to one or more circuits of Peri Region 1732 via a metal interlayer segment (not depicted) positioned in the gap between Planes/staircases. Metal line 1724 of metal layer M4 is connected to I/O pad 1706, extending across the top surface of memory die 201, directly on top of at least a portion of the gap(s) between Planes/staircases and extending perpendicular to the gap(s). Metal line 1734 of D2 or D3 connects metal line 1724 to one or more circuits of Peri Region 1738 via a metal interlayer segment (not depicted) positioned in the gap between Planes/staircases. Metal line 1736 of D2 or D3 connects I/O pad 1708 to one or more circuits of Peri Region 1734. Note that FIGS. 7-17 show embodiments with eight Planes; however, other embodiments with, more than eight planes or less than eight planes can also be used.

Figure 18:
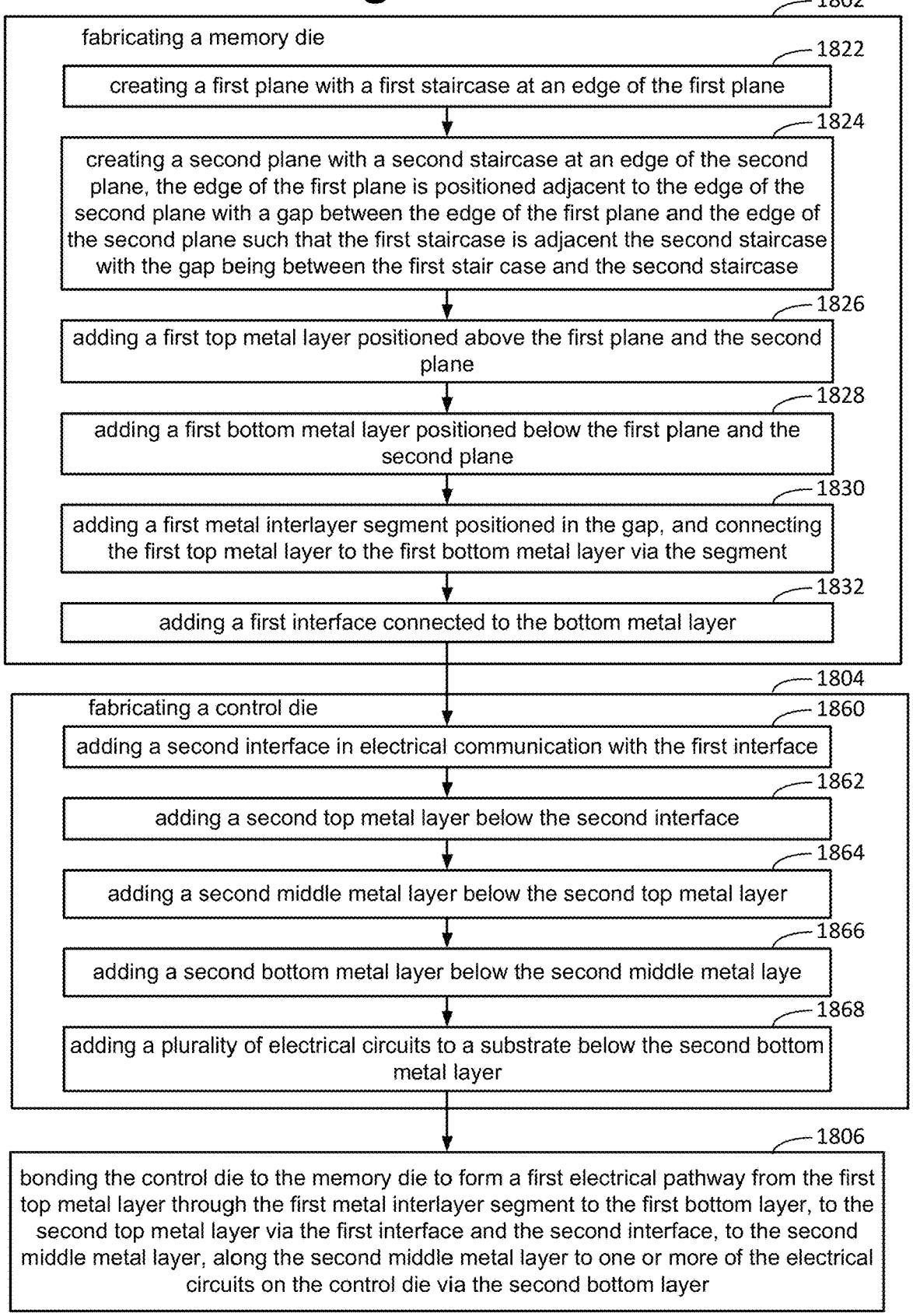
FIG. 18 is a flow chart describing one embodiment of a process for fabricating an integrated memory assembly.

FIG. 18 is a flow chart describing one embodiment of a process for fabricating an integrated memory assembly to create the structures of FIGS. 11-17. In some embodiments, the process of FIG. 18 is performed in the order depicted. In other embodiments, the order for performing the steps of FIG. 18 can be changed from the order depicted in FIG. 18. In step 1802, the memory die 201 is fabricated/created. In step 1804, the control die 211 is fabricated/created. In step 1806, the control die 211 is bonded (or connected via another means) to the memory die 201. The process of FIG. 18, after bonding the control die to the memory die, results in formation of a first electrical pathway from the first top metal layer (e.g., M4) through the first metal interlayer segment (e.g., positioned in the gap) to the first bottom layers (e.g., M1/M0), to the second top metal layer (e.g., D4) via the first interface (e.g., bond pad 1230) and the second interface (e.g., bond pad 1232), to the second middle metal layer(s) (e.g., D3 and/or D2), along the second middle metal layer to one or more of the electrical circuits on the control die 211 via the second bottom layer (e.g., D0 and/or D1).

In one embodiment, the fabricating of the memory die 201 of step 1802 comprises creating a first plane with a first staircase at an edge of the first plane in step 1822 and creating a second plane with a second staircase at an edge of the second plane in step 1824. The edge of the first plane is positioned adjacent to the edge of the second plane with a gap between the edge of the first plane and the edge of the second plane such that the first staircase is adjacent the second staircase with the gap being between the first staircase and the second staircase, for example, as depicted in FIG. 13. The fabricating the memory die 201 of step 1802 further comprises adding a first top metal layer (e.g., M4) positioned above the first plane and the second plane in step 1826, adding a first bottom metal layer (e.g., M0 and/or M1) positioned below the first plane and the second plane in step 1828, adding a first metal interlayer segment positioned in the gap and connecting the first top metal layer to the first bottom metal layer via the first metal interlayer segment in step 1830, and adding a first interface (e.g., bond pad) connected to the bottom metal layer in step 1832.

In one embodiment, the fabricating of the control die 211 of step 1804 comprises adding a second interface (e.g., bond pad) in electrical communication with the first interface in step 1860, adding a second top metal layer (e.g., D4) below the second interface in step 1862, adding a second middle metal layer (e.g., D3 and/or D2) below the second top metal layer in step 1864, adding a second bottom metal layer (e.g., D2, D1 and/or D0) below the second middle metal layer in step 1866, and adding a plurality of electrical circuits to a substrate below the second bottom metal layer in step 1868.

Figure 19:
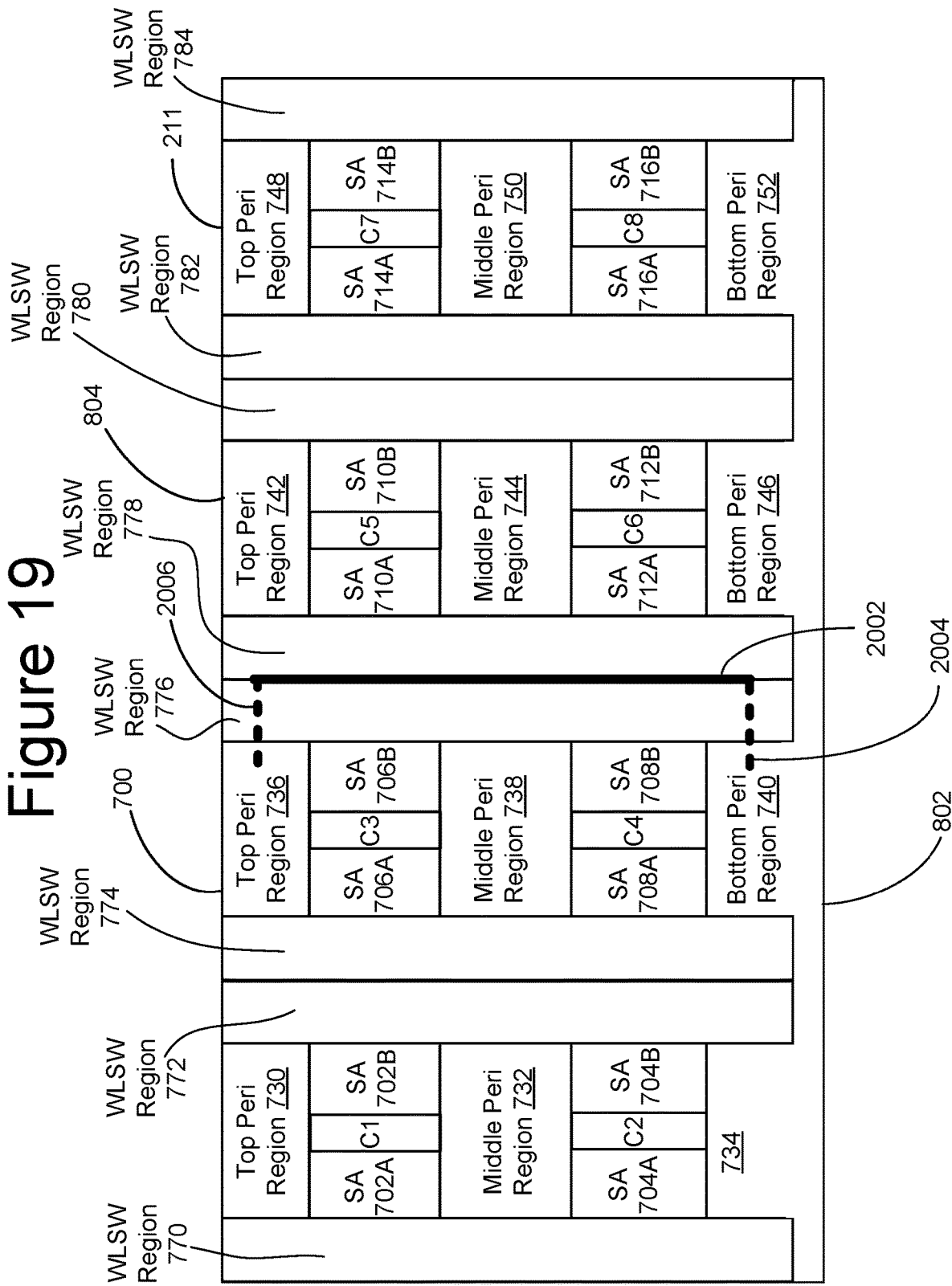
FIG. 19 is a top view of the circuits on a control die with a portion of a top metal layer superimposed above the circuits.
Figure 20:
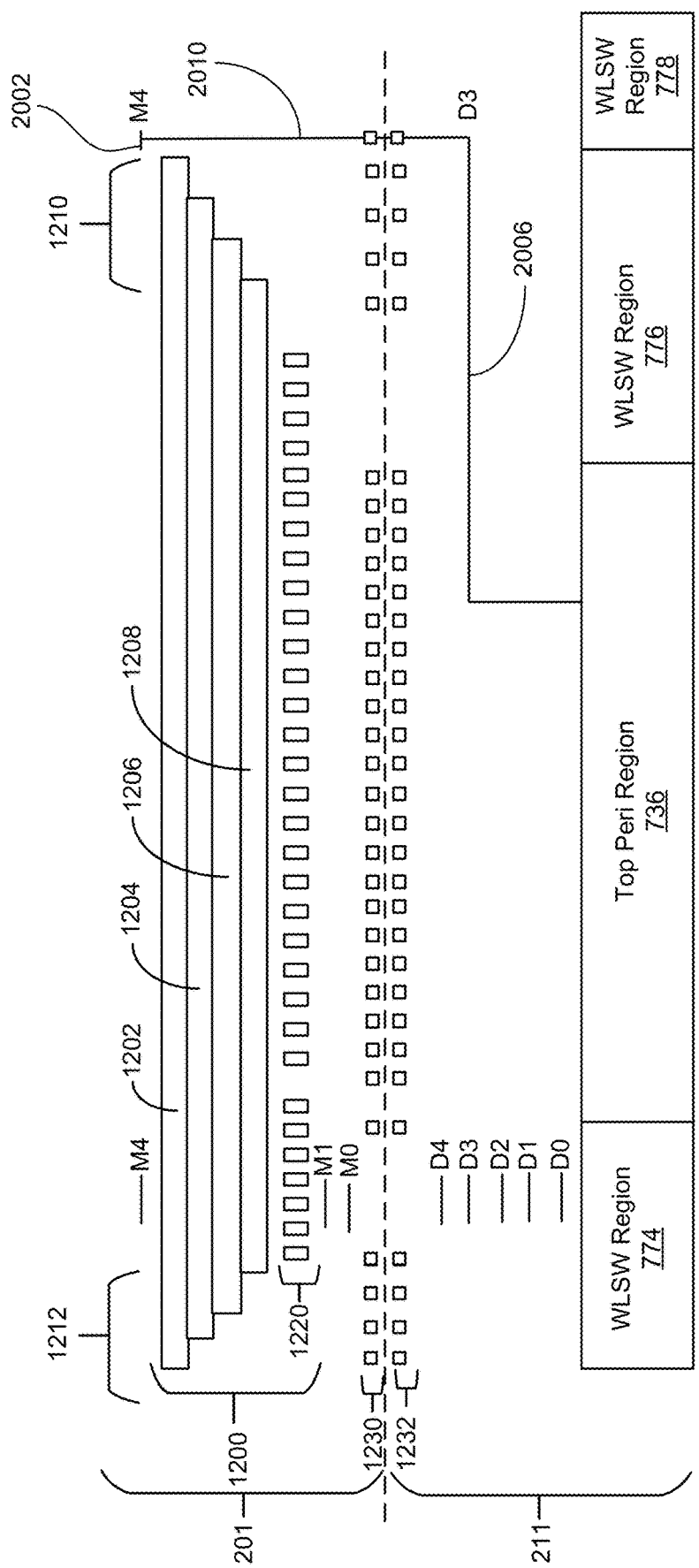
FIG. 20 is a cross section of an integrated memory assembly.

In the embodiment of FIG. 11, signal line 1110 of top metal layer M4 connects to an I/O pad. In other embodiments, such as the embodiment of FIG. 19-21, the signal line of top metal layer M4 need not connect to an I/O pad and will instead be used to transfer a signal between different areas of the integrated memory assembly. FIG. 19 depicts the top view of control die 211 and also shows a portion of another embodiment of a top metal layer of memory die 201 superimposed above the circuits on the top surface of substrate 700 of control die 211. FIGS. 20 and 21 are cross sections of integrated memory assembly 207, corresponding to the structure of FIG. 19, that includes cross sections of memory die 201 and control die 211. FIG. 19 shows signal line 2002 of top metal layer M4 (above the memory arrays) extending across the integrated memory assembly (e.g., from ends 802/803 to ends 804/805), directly on top of the gaps between Planes, and extending parallel to the gaps. In other embodiments, signal line 2002 of top metal layer M4 can extend perpendicular to the gaps (as discussed above with respect to FIGS. 15-17). Metal interlayer segment 2010 (depicted in FIG. 20), positioned in a gap between Plane 3 and Plane 5 (and between the respective staircases), connects metal line 2002 to a metal line 2006 of metal layer D3 (or D2) on control die 211 which connects to a circuit of Top Peri Region 736 on the top surface of substrate 700 of control die 211 via other metal layers. Metal interlayer segment 2012 (depicted in FIG. 21), positioned in a gap between Plane 2 and Plane 4 (and between the respective staircases), connects metal line 2002 to a metal line 2004 of metal layer D3 (or D2) on control die 211 which connects to a circuit of Bottom Peri Region 740 on the top surface of substrate 700 of control die 211 via three other metal layers. FIG. 21 shows Plane 2 having staircases 2020 and 2022. Metal line 2002 of the top metal layer M4 is configured to carry one of a global power signal, global data signal, and a global command signal from a first set of one or more circuits on the surface of the substrate of control die 201 to a second set of one or more circuits on the surface of the substrate of control die 201 as part of an electrical pathway. That electrical pathway comprises one or more circuits of Bottom Peri Region 740 to signal line 2004 of metal layer D3 (via D0, D1 and D2), to top metal layer D4, through bond pads 1232/1230, through metal layers M0 and M1, to metal interlayer segment 2012 positioned in a gap between Planes (and staircases), to and along metal line 2002 to metal interlayer segment 2010, to the bottom metal layers M1 and M0, to the top metal layer D4 via bond pads 1230/1232, to signal line 2006 of metal layer D3, along signal line 2006 of metal layer D3, to the one or more electrical circuits of Top Peri Region 736 via metals layers D2, D1 and D0.

A non-volatile memory have been disclosed that reduces congestion in the metal interconnect layers so that the semiconductor die can remain small in size, while providing for all intended functionality.

One embodiment includes an integrated memory assembly apparatus, comprising a first semiconductor die (e.g., memory die) and a second semiconductor die (e.g., controldie) physically connected (e.g., bonded) to the first semiconductor die. The first semiconductor die comprising: a first non-volatile memory structure adjacent a second non-volatile memory structure with a gap between the first non-volatile memory structure and the second non-volatile memory structure, the first non-volatile memory structure having a stack of alternating conductive and dielectric layers forming a first staircase at an edge of the first non-volatile memory structure facing the second non-volatile memory structure, the second non-volatile memory structure having a stack of alternating conductive and dielectric layers forming a second staircase at an edge of the second non-volatile memory structure facing the first non-volatile memory structure; a first top metal layer positioned above the first non-volatile memory structure and the second non-volatile memory structure; and a first metal interlayer segment positioned in the gap, positioned between the first staircase and the second staircase, and connected to the first top metal layer. The second semiconductor die comprising: an electrical circuit and a metal transmission layer connected to the electrical circuit and the first metal interlayer segment. The metal transmission layer is configured to communicate a signal from the first top metal layer to the electrical circuit (e.g., via the first metal interconnect layer segment, the metal transmission layer and other metal layers).

One embodiment incudes a method, comprising: fabricating a memory die, fabricating a control die, and bonding the control die to the memory die. The fabricating the memory die comprises: creating a first plane with a first staircase at an edge of the first plane, creating a second plane with a second staircase at an edge of the second plane (the edge of the first plane is positioned adjacent to the edge of the second plane with a gap between the edge of the first plane and the edge of the second plane such that the first staircase is adjacent the second staircase with the gap being between the first staircase and the second staircase), adding a first top metal layer positioned above the first plane and the second plane, adding a first bottom metal layer positioned below the first plane positioned and the second plane, adding a first metal interlayer segment positioned in the gap and connecting the first top metal layer to the first bottom metal layer via the first metal interlayer segment, and adding a first interface connected to the bottom metal layer. The fabricating the control die comprises: adding a second interface in electrical communication with the first interface, adding a second top metal layer below the second interface, adding a second middle metal layer below the second top metal layer, adding a second bottom metal layer below the second middle metal layer, and adding a plurality of electrical circuits to a substrate below the second bottom metal layer. The bonding the control die to the memory die forms a first electrical pathway from the first top metal layer through the first metal interlayer segment to the first bottom layer, to the second top layer via the first interface and the second interface, to the second top metal layer, to the second middle metal layer, along the second middle metal layer to one or more of the electrical circuits on the control die via the second bottom layer.

One embodiment includes an integrated memory assembly apparatus, comprising: a memory die and a control die bonded to the memory die. The memory die comprising: a first non-volatile memory structure with a first staircase at an edge of the first non-volatile memory structure; a second non-volatile memory structure with a second staircase at an edge of the second non-volatile memory structure, the edge of the first non-volatile memory structure is positioned adjacent to the edge of the second non-volatile memory structure with a gap between the edge of the first non-volatile memory structure and the edge of the second non-volatile memory structure such that the first staircase is adjacent the second staircase with the gap being between the first staircase and the second staircase; a first top metal layer positioned above the first non-volatile memory structure and the second non-volatile memory structure; a first bottom metal layer positioned below the first non-volatile memory structure positioned and the second non-volatile memory structure; a first metal interlayer segment positioned in the gap and connecting the first top metal layer to the first bottom metal layer; and a first interface connected to the bottom metal layer. The control die comprising: a second interface in electrical communication with the first interface, a second top metal layer below the second interface, a second middle metal layer below the second top metal layer, a second bottom metal layer below the second middle metal layer, and a plurality of electrical circuits below the second bottom metal layer. A first electrical pathway exists from the first top metal layer through the first metal interlayer segment to the first bottom metal layer, to the second top metal layer via the first interface and the second interface, to the second middle metal layer, along the second middle metal layer to one or more of the electrical circuits on the control die via the second bottom layer.

In one example implementation, the memory die has a first end and a second end opposite the first end; the memory die has a middle that is between the first end of the memory die and the second end of the memory die; the control die has a first end corresponding in location to the first end of the memory die; the control die has a second end corresponding in location to the second end of the memory die; the control die has a middle that is between the first end of the control die and the second end of the control die; the first top metal layer runs from the first end of the memory die to the second end of the memory die; the first top metal layer connects to I/O pads at the first end of the memory die; the first metal interlayer segment is positioned at and connects to the first top metal layer at the middle of the memory die; the first electrical pathway runs from the second interface to the second middle metal layer and then to at least one electrical circuit of the plurality of electrical circuits at the middle of the control die; the memory die further comprises a second metal interlayer segment positioned in the gap and connecting the first top metal layer to the first bottom metal layer; the second metal interlayer segment is positioned at and connects to the first top metal layer at the second end of the memory die; and a second electrical pathway exists from the first top metal layer through the second metal interlayer segment to the first bottom layer, to the second top layer via the first interface and the second interface, to the second top metal layer, to the second middle metal layer at the second end of the memory die, along the second middle metal layer to one or more of the electrical circuits on the control die via the second bottom layer at the second end of the memory die.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An integrated memory assembly apparatus, comprising:
   a first semiconductor die comprising:
      a first non-volatile memory structure adjacent a second non-volatile memory structure with a gap between the first non-volatile memory structure and the second non-volatile memory structure, the first non-volatile memory structure having a stack of alternating conductive and dielectric layers forming a first staircase at an edge of the first non-volatile memory structure facing the second non-volatile memory structure, the second non-volatile memory structure having a stack of alternating conductive and dielectric layers forming a second staircase at an edge of the second non-volatile memory structure facing the first non-volatile memory structure,
      a first top metal layer positioned above the first non-volatile memory structure and the second non-volatile memory structure,
      a first bottom metal layer positioned below the first non-volatile memory structure and the second non-volatile memory structure, and
      a first metal interlayer segment positioned in the gap, positioned between the first staircase and the second staircase, connected to the first top metal layer and connected to the first bottom metal layer; and a second semiconductor die physically connected to the first semiconductor die, the second semiconductor die comprising:
  an electrical circuit, and
  a metal transmission layer connected to the electrical circuit and the first metal interlayer segment via the first bottom metal layer, the metal transmission layer is configured to communicate a signal from the first top metal layer to the electrical circuit.

2. The apparatus of claim 1, wherein:
the first semiconductor die further comprises an I/O pad on a top surface of the first semiconductor die at a first side of the first semiconductor die; and
the first top metal layer is connected to the I/O pad and extends across the first semiconductor die from the I/O.

3. The apparatus of claim 1, wherein:
the first top metal layer is directly on top of at least a portion of the gap and extends parallel to the gap.

4. The apparatus of claim 1, wherein:
the first top metal layer is directly on top of at least a portion of the gap and extends perpendicular to the gap.

5. The apparatus of claim 1, wherein:
the first semiconductor die further comprises a first interface connected to the bottom metal layer; and
the second semiconductor die further comprises:
  a second interface in electrical communication with the first interface,
  a second top metal layer below the second interface and above the metal transmission layer, and
  a second bottom metal layer below the metal transmission layer;
  the metal transmission layer is connected to the first metal interlayer segment via the first bottom metal layer, the first interface, the second interface and the second top metal layer;
  a first electrical pathway exists from the first top metal layer through the first metal interlayer segment to the first bottom metal layer, to the second top metal layer via the first interface and the second interface, to the metal transmission layer, along the metal transmission layer to the electrical circuit on the second semiconductor die via the second bottom layer.

6. The apparatus of claim 5, wherein:
the first semiconductor die has a first end and a second end opposite the first end;
the first semiconductor die has a middle that is between the first end of the first semiconductor die and the second end of the first semiconductor die;
the second semiconductor die has a first end corresponding in location to the first end of the first semiconductor die;
the second semiconductor die has a second end corresponding in location to the second end of the first semiconductor die;
the second semiconductor die has a middle that is between the first end of the second semiconductor die and the second end of the second semiconductor die;
the first top metal layer runs from the first end of the first semiconductor die to at least the middle of the first semiconductor die;
the first top metal layer connects to I/O pads at the first end of the first semiconductor die;
the first metal interlayer segment is positioned at and connects to the first top metal layer at the middle of the first semiconductor die; and
the first electrical pathway runs from the second interface to the metal transmission layer and then to the electrical circuit at the middle of the second semiconductor die.

7. The apparatus of claim 5, wherein:
the first semiconductor die has a first end and a second end opposite the first end;
the first semiconductor die has a middle that is between the first end of the first semiconductor die and the second end of the first semiconductor die;
the second semiconductor die has a first end corresponding in location to the first end of the first semiconductor die;
the second semiconductor die has a second end corresponding in location to the second end of the first semiconductor die;
the second semiconductor die has a middle that is between the first end of the second semiconductor die and the second end of the second semiconductor die;
the first top metal layer runs from the first end of the first semiconductor die to the second end of the first semiconductor die;
the first top metal layer connects to I/O pads at the first end of the first semiconductor die;
the first metal interlayer segment is positioned at and connects to the first top metal layer at the second end of the first semiconductor die; and
the first electrical pathway runs from the second interface to the metal transmission layer and then to the electrical circuit at the second end of the second semiconductor die.

8. The apparatus of claim 1, wherein:
the first semiconductor die comprises additional non-volatile memory structures each having additional staircases with additional gaps between the additional staircases and additional metal interlayer segments positioned in the additional gaps and connecting to the first top metal layer.

9. The apparatus of claim 1, wherein:
the first semiconductor die is a memory die; and
the second semiconductor die is a control die bonded to the memory die to form an integrated memory assembly with the memory die.

10. The apparatus of claim 1, wherein:
the first non-volatile memory structure and the second non-volatile memory structure are three dimensional NAND arrays with vertical charge trapping layers.

11. The apparatus of claim 1, wherein:
the second semiconductor die includes a substrate and sense amplifiers positioned on the substrate, the electrical circuit is positioned between sense amplifiers; and
the second semiconductor die further comprises a second top metal layer above the metal transmission layer and a second bottom metal layer below the metal transmission layer.

12. The apparatus of claim 1, wherein:
the first top metal layer is configured to carry one of a global power signal, global data signal, and a global command signal; and
the first non-volatile memory structure and the second non-volatile memory structure are planes of non-volatile memory cells, each plane includes multiple blocks of the memory cells.

13. A method, comprising:
fabricating a memory die, comprising:
  creating a first plane with a first staircase at an edge of the first plane, creating a second plane with a second staircase at an edge of the second plane, the edge of the first plane is positioned adjacent to the edge of the second plane with a gap between the edge of the first plane and the edge of the second plane such that the first staircase is adjacent the second staircase with the gap being between the first staircase and the second staircase, adding a first top metal layer positioned above the first plane and the second plane, adding a first bottom metal layer positioned below the first plane and the second plane, adding a first metal interlayer segment positioned in the gap, and connecting the first top metal layer to the first bottom metal layer via the first metal interlayer segment, and adding a first interface connected to the bottom metal layer;

fabricating a control die, comprising:
adding a second interface in electrical communication with the first interface,
adding a second top metal layer below the second interface,
adding a second middle metal layer below the second top metal layer,
adding a second bottom metal layer below the second middle metal layer, and
adding a plurality of electrical circuits to a substrate below the second bottom metal layer; and bonding the control die to the memory die to form a first electrical pathway from the first top metal layer through the first metal interlayer segment to the first bottom layer, to the second top metal layer via the first interface and the second interface, to the second middle metal layer, along the second middle metal layer to one or more of the electrical circuits on the control die via the second bottom layer.

14. The method of claim 13, wherein:
the memory die has a first end and a second end opposite the first end;
the memory die has a middle that is between the first end of the memory die and the second end of the memory die;
the control die has a first end corresponding in location to the first end of the memory die;
the control die has a second end corresponding in location to the second end of the memory die;
the control die has a middle that is between the first end of the control die and the second end of the control die;
the first top metal layer runs from the first end of the memory die to the second end of the memory die;
the first top metal layer connects to I/O pads at the first end of the memory die;
the first metal interlayer segment is positioned at and connects to the first top metal layer at the middle of the memory die; and
the first electrical pathway runs from the second interface to the second middle metal layer and then to at least one electrical circuit of the plurality of electrical circuits at the middle of the control die.

15. The method of claim 13, wherein:
the memory die has a first end and a second end opposite the first end;
the memory die has a middle that is between the first end of the memory die and the second end of the memory die;
the control die has a first end corresponding in location to the first end of the memory die;
the control die has a second end corresponding in location to the second end of the memory die;
the control die has a middle that is between the first end of the control die and the second end of the control die;
the first top metal layer runs from the first end of the memory die to the second end of the memory die;
the first top metal layer connects to I/O pads at the first end of the memory die;
the first metal interlayer segment is positioned at and connects to the first top metal layer at the second end of the memory die; and
the first electrical pathway runs from the second interface to the second middle metal layer and then to at least one electrical circuit of the plurality of electrical circuits at the second end of the control die.

16. An integrated memory assembly apparatus, comprising:
a memory die comprising:
a first non-volatile memory structure with a first staircase at an edge of the first non-volatile memory structure,
a second non-volatile memory structure with a second staircase at an edge of the second non-volatile memory structure, the edge of the first non-volatile memory structure is positioned adjacent to the edge of the second non-volatile memory structure with a gap between the edge of the first non-volatile memory structure and the edge of the second non-volatile memory structure such that the first staircase is adjacent the second staircase with the gap being between the first staircase and the second staircase,
a first top metal layer positioned above the first non-volatile memory structure and the second non-volatile memory structure,
a first bottom metal layer positioned below the first non-volatile memory structure and the second non-volatile memory structure,
a first metal interlayer segment positioned in the gap and connecting the first top metal layer to the first bottom metal layer, and
a first interface connected to the bottom metal layer; and
a control die bonded to the memory die, the control die comprising:
a second interface in electrical communication with the first interface,
a second top metal layer below the second interface,
a second middle metal layer below the second top metal layer,
a second bottom metal layer below the second middle metal layer, and
a plurality of electrical circuits below the second bottom metal layer;
a first electrical pathway exists from the first top metal layer through the first metal interlayer segment to the first bottom metal layer, to the second top metal layer via the first interface and the second interface, to the second top metal layer, to the second middle metal layer, along the second middle metal layer to one or more of the electrical circuits on the control die via the second bottom layer.

17. The apparatus of claim 16, wherein:
the memory die has a first end and a second end opposite the first end;
the memory die has a middle that is between the first end of the memory die and the second end of the memory die;

the control die has a first end corresponding in location to the first end of the memory die;
the control die has a second end corresponding in location to the second end of the memory die;
the control die has a middle that is between the first end of the control die and the second end of the control die;
the first top metal layer runs from the first end of the memory die to the second end of the memory die;
the first top metal layer connects to I/O pads at the first end of the memory die;
the first metal interlayer segment is positioned at and connects to the first top metal layer at the middle of the memory die; and
the first electrical pathway runs from the second interface to the second middle metal layer and then to at least one electrical circuit of the plurality of electrical circuits at the middle of the control die.

18. The apparatus of claim 16, wherein:
the memory die has a first end and a second end opposite the first end;
the memory die has a middle that is between the first end of the memory die and the second end of the memory die;
the control die has a first end corresponding in location to the first end of the memory die;
the control die has a second end corresponding in location to the second end of the memory die;
the control die has a middle that is between the first end of the control die and the second end of the control die;
the first top metal layer runs from the first end of the memory die to the second end of the memory die;
the first top metal layer connects to I/O pads at the first end of the memory die;
the first metal interlayer segment is positioned at and connects to the first top metal layer at the second end of the memory die; and
the first electrical pathway runs from the second interface to the second middle metal layer and then to at least one electrical circuit of the plurality of electrical circuits at the second end of the control die.

19. The apparatus of claim 16, wherein:
the memory die has a first end and a second end opposite the first end;
the memory die has a middle that is between the first end of the memory die and the second end of the memory die;
the control die has a first end corresponding in location to the first end of the memory die;
the control die has a second end corresponding in location to the second end of the memory die;
the control die has a middle that is between the first end of the control die and the second end of the control die;
the first top metal layer runs from the first end of the memory die to the second end of the memory die;
the first top metal layer connects to I/O pads at the first end of the memory die;
the first metal interlayer segment is positioned at and connects to the first top metal layer at the middle of the memory die;
the first electrical pathway runs from the second interface to the second middle metal layer and then to at least one electrical circuit of the plurality of electrical circuits at the middle of the control die;
the memory die further comprises a second metal interlayer segment positioned in the gap and connecting the first top metal layer to the first bottom metal layer;
the second metal interlayer segment is positioned at and connects to the first top metal layer at the second end of the memory die; and
a second electrical pathway exists from the first top metal layer through the second metal interlayer segment to the first bottom layer, to the second top layer via the first interface and the second interface, to the second top metal layer, to the second middle metal layer at the second end of the memory die, along the second middle metal layer to one or more of the electrical circuits on the control die via the second bottom layer at the second end of the memory die.

* * * * *